(12) United States Patent
Tu

(10) Patent No.: US 10,811,347 B2
(45) Date of Patent: Oct. 20, 2020

(54) SEMICONDUCTOR DEVICE PACKAGE AND METHOD OF MANUFACTURING THE SAME

(71) Applicant: Advanced Semiconductor Engineering, Inc., Kaohsiung (TW)

(72) Inventor: Shun-Tsat Tu, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 16/234,048

(22) Filed: Dec. 27, 2018

(65) Prior Publication Data

US 2020/0211942 A1 Jul. 2, 2020

(51) Int. Cl.
| | |
|---|---|
| *H01L 27/11* | (2006.01) |
| *H01L 23/52* | (2006.01) |
| *H01L 29/10* | (2006.01) |
| *H01L 23/498* | (2006.01) |
| *H01L 21/48* | (2006.01) |

(52) U.S. Cl.
CPC .... *H01L 23/49816* (2013.01); *H01L 21/4853* (2013.01); *H01L 21/4857* (2013.01); *H01L 23/49822* (2013.01); *H01L 23/49894* (2013.01)

(58) Field of Classification Search
CPC ........... H01L 23/49816; H01L 21/4853; H01L 21/4857; H01L 23/49822; H01L 23/49894
USPC ........................................................ 257/668
See application file for complete search history.

(56) References Cited

U.S. PATENT DOCUMENTS

| | | | |
|---|---|---|---|
| 10,056,347 B2 | 8/2018 | Chiu et al. | |
| 10,186,492 B1* | 1/2019 | Wan | ......................... H01Q 9/30 |
| 2013/0200528 A1* | 8/2013 | Lin | ....................... H01L 21/561 |
| | | | 257/774 |
| 2014/0048906 A1* | 2/2014 | Shim, II | ................. H01L 23/481 |
| | | | 257/531 |
| 2014/0097525 A1* | 4/2014 | Kim | ...................... H01L 23/481 |
| | | | 257/668 |
| 2014/0103503 A1* | 4/2014 | Lee | .......................... H01L 24/94 |
| | | | 257/668 |
| 2014/0103527 A1* | 4/2014 | Marimuthu | ....... H01L 23/49833 |
| | | | 257/737 |
| 2015/0091145 A1* | 4/2015 | Lin | .................... H01L 23/49827 |
| | | | 257/668 |
| 2015/0097277 A1* | 4/2015 | Chen | ................... H01L 23/3135 |
| | | | 257/668 |
| 2015/0179616 A1* | 6/2015 | Lin | ......................... H01L 25/50 |
| 2015/0279776 A1* | 10/2015 | Hu | .................... H01L 21/02282 |
| | | | 257/668 |

(Continued)

*Primary Examiner* — Sheikh Maruf
(74) *Attorney, Agent, or Firm* — Foley & Lardner LLP

(57) ABSTRACT

A semiconductor device package is provided, which includes a semiconductor device, a redistribution layer, an under bump metallurgy (UBM) structure, a passivation layer and a protection layer. The semiconductor device has an active surface. The redistribution layer is disposed on the active surface of the semiconductor device and electrically connected to the semiconductor device. The UBM structure is disposed on the redistribution layer. The passivation layer is disposed on the redistribution layer and surrounding the UBM structure and having a first surface. The protection layer is disposed on the redistribution layer and having a first surface. The first surface of the passivation layer is substantially coplanar with the first surface of the protection layer.

20 Claims, 38 Drawing Sheets

(56) References Cited

U.S. PATENT DOCUMENTS

| | | | |
|---|---|---|---|
| 2015/0279778 A1* | 10/2015 | Camacho | H01L 21/56 257/737 |
| 2016/0035659 A1* | 2/2016 | Nah | H01L 24/09 257/668 |
| 2016/0181195 A1* | 6/2016 | Kim | H01L 23/3121 257/668 |
| 2016/0204079 A1* | 7/2016 | Lu | H01L 23/49811 257/668 |
| 2016/0240500 A1* | 8/2016 | Huang | H01L 24/11 |
| 2017/0092597 A1* | 3/2017 | Jeng | H01L 21/02164 |
| 2017/0236788 A1* | 8/2017 | Lin | H01L 24/97 257/668 |
| 2018/0026019 A1* | 1/2018 | Tao | H01L 23/3128 257/668 |
| 2018/0096939 A1* | 4/2018 | Chiu | H01L 23/3114 |
| 2019/0027446 A1* | 1/2019 | Cheng | H01L 25/50 |
| 2019/0131283 A1* | 5/2019 | Chen | H01L 24/05 |
| 2019/0139896 A1* | 5/2019 | Hsu | H01L 23/49811 |
| 2019/0148274 A1* | 5/2019 | Yu | H01L 21/4853 257/668 |
| 2019/0148310 A1* | 5/2019 | Leong | H01L 23/562 257/668 |
| 2019/0148311 A1* | 5/2019 | Eid | H01L 23/49838 257/668 |
| 2019/0355679 A1* | 11/2019 | Wu | H01L 23/66 |

* cited by examiner

SEMICONDUCTOR DEVICE PACKAGE AND METHOD OF MANUFACTURING THE SAME

TECHNICAL FIELD

The present disclosure generally relates to a semiconductor device package, and more particularly, to a semiconductor device package manufactured by a chip last process.

BACKGROUND

A semiconductor device package may include an under bump metallurgy (UBM) structure for external connection. During manufacture of the UBM structure, a nickel (Ni) layer is formed to facilitate growing a gold (Au) layer and is removed in the subsequent operation.

However, the operation of removing Ni layer may adversely affect the UBM structure (e.g. crack or peel-off issue).

SUMMARY

Some embodiments of the subject application provide a semiconductor device package, which includes a semiconductor device, a redistribution layer, an under bump metallurgy (UBM) structure, a passivation layer and a protection layer. The semiconductor device has an active surface. The redistribution layer is disposed on the active surface of the semiconductor device and electrically connected to the semiconductor device. The UBM structure is disposed on the redistribution layer. The passivation layer is disposed on the redistribution layer and surrounds the UBM structure and has a first surface. The protection layer is disposed on the redistribution layer and has a first surface. The first surface of the passivation layer is substantially coplanar with the first surface of the protection layer.

Some embodiments of the subject application provide a semiconductor device package, which includes a semiconductor device, a redistribution layer, an under bump metallurgy (UBM) structure, a passivation layer, a first patterned conductive layer and a connection element. The semiconductor device has an active surface. The redistribution layer is disposed on the active surface of the semiconductor device and electrically connected to the semiconductor device. The UBM structure is disposed on the redistribution layer. The passivation layer is disposed on the redistribution layer and surrounds the UBM structure. The first patterned conductive layer is disposed on the UBM structure. The connection element is disposed between the UBM structure and a first patterned conductive layer.

Some embodiments of the subject application provide a method of forming a semiconductor device package. The method includes providing a carrier. The method further includes disposing a passivation layer and an under bump metallurgy (UBM) structure on the carrier. The method further includes disposing a patterned conductive layer on the passivation layer and the UBM structure. The method further includes disposing a redistribution layer on the patterned conductive layer. The method further includes disposing a semiconductor device on the redistribution layer and electrically connected to the redistribution layer. The method further includes exposing the patterned conductive layer to air or oxygen and forming a protection layer.

BRIEF DESCRIPTION OF THE DRAWINGS

Aspects of the present disclosure are best understood from the following detailed description when read with the accompanying drawings. It is noted that various features may not be drawn to scale, and the dimensions of the various features may be arbitrarily increased or reduced for clarity of discussion.

FIG. 5A, FIG. 5B, FIG. 5C, FIG. 5D, FIG. 5E, FIG. 5F, FIG. 5G, FIG. 5H, FIG. 5I, FIG. 5J, FIG. 5K, FIG. 5L, FIG. 5M, FIG. 5N, FIG. 5O and FIG. 5P illustrate operations of manufacturing a semiconductor device package in accordance with some embodiments of the subject application.

Common reference numerals are used throughout the drawings and the detailed description to indicate the same or similar elements. The present disclosure will be more apparent from the following detailed description taken in conjunction with the accompanying drawings.

DETAILED DESCRIPTION

Figure 1A:
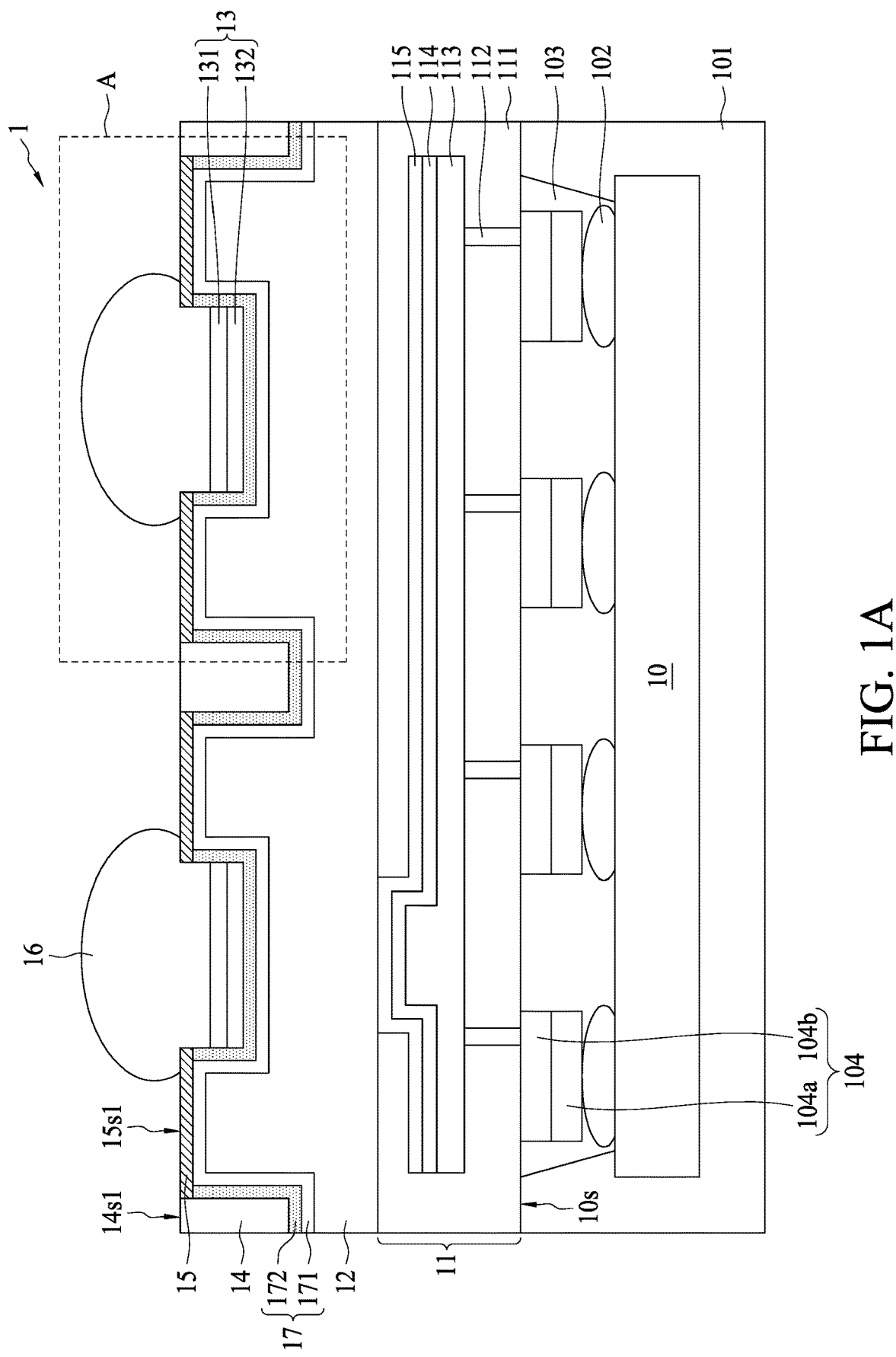
FIG. 1A illustrates a cross-sectional view of a semiconductor device package in accordance with some embodiments of the subject application.

Embodiments of the present disclosure and use thereof are discussed in detail below. It should be appreciated, however, that the embodiments set forth many applicable concepts that can be embodied in a wide variety of specific contexts. It is to be understood that the following disclosure provides for many different embodiments or examples of implementing different features of various embodiments. Specific examples of components and arrangements are described below for purposes of discussion. These are, of course, merely examples and are not intended to be limiting.

Spatial descriptions, including such terms as "above," "below," "up," "left," "right," "down," "top," "bottom," "vertical," "horizontal," "side," "higher," "lower," "upper," "over," "under," and so forth, are used herein with respect to an orientation shown in corresponding figures unless otherwise specified. It should be understood that the spatial descriptions used herein are for purposes of illustration, and that practical implementations of the structures described herein can be spatially arranged in any orientation or manner, provided that the merits of embodiments of this disclosure are not deviated from by such arrangement.

Embodiments, or examples, illustrated in the figures are disclosed below using specific language. It will nevertheless be understood that the embodiments and examples are not intended to be limiting. Any alterations and modifications of the disclosed embodiments, and any further applications of the principles disclosed in this document, as would normally occur to one of ordinary skill in the pertinent art, fall within the scope of this disclosure.

In addition, the present disclosure may repeat reference numerals and/or letters in the various examples. This repetition is for the purpose of simplicity and clarity and does not in itself dictate a relationship between the various embodiments and/or configurations discussed herein.

FIG. 1A illustrates a cross-sectional view of a semiconductor device package in accordance with some embodiments of the subject application.

Referring to FIG. 1A, the semiconductor device package 1 includes a semiconductor device 10, a redistribution layer 11, a conductive pad 12, under bump metallurgy (UBM) structures 13, a passivation layer (or patterned passivation layer) 14, a protection layer 15 and a connection element 16.

The semiconductor device 10 may include, for example but is not limited to, a semiconductor die (or chip) having circuit integrated therein or the like. Although a single semiconductor device 10 is illustrated in FIG. 1A, it is contemplated that the semiconductor device package 1 may include more device(s) or component(s).

The semiconductor device 10 is electrically connected to the redistribution layer 11 via the connection elements 102 and UBM structures 104.

The connection elements 102 may include solder, copper or other suitable material(s). The connection elements 102 may include an alloy of gold and tin solder. The connection elements 102 may include an alloy of silver and tin solder.

The UBM structure 104 includes conductive layers 104a and 104b. The conductive layer 104a is disposed on the connection element 102. The conductive layer 104a may include, for example but is not limited to, copper or other suitable conductive material. The conductive layer 104b is disposed on the conductive layer 104a. The conductive layer 104b may include, for example but is not limited to, nickel or other suitable conductive or barrier material. The conductive layer 104b may include intermetallic compound (IMC), for example but is not limited to, $Ni_3Sn_4$.

An underfill or encapsulant 103 is disposed between the semiconductor device 10 and the redistribution layer 11. The underfill or encapsulant 103 covers or encapsulates the connection elements 102. The underfill or encapsulant 103 covers or encapsulates the UBM structures 104. The encapsulant 103 may include epoxy. The encapsulant 103 may include fillers or particles.

An encapsulant 101 is disposed on the redistribution layer 11. The encapsulant 101 covers or encapsulates the semiconductor device 10. The encapsulant 101 covers or encapsulates the connection element 102. The encapsulant 101 covers or encapsulates the UBM structures 104. The encapsulant 101 may include epoxy. The encapsulant 101 may include fillers or particles.

The redistribution layer 11 includes a dielectric layer 111, conductive interconnections (e.g. through-vias) 112 and patterned conductive layers 113, 114, 115.

The conductive interconnections 112 are disposed on the UBM structure 104. Each of the conductive interconnections 112 is disposed on a UBM structure 104. The conductive interconnections 112 are electrically connected to the semiconductor device 10.

The patterned conductive layer 113 is disposed on the conductive interconnections 112. The patterned conductive layer 114 is disposed on the patterned conductive layer 113. The patterned conductive layer 115 is disposed on the patterned conductive layer 114.

The patterned conductive layer 113 may include, for example but is not limited to, copper or other suitable material(s). The patterned conductive layer 114 may include, for example but is not limited to, copper or other suitable material(s). The patterned conductive layer 115 may include, for example but is not limited to, titanium or other suitable material(s). The patterned conductive layers 114 and 115 may function as a seed layer during manufacture.

The dielectric layer 111 is disposed on a surface 10s.

The conductive pad 12 is disposed on the redistribution layer 11. The conductive pad 12 may include, for example but is not limited to, copper or other suitable material(s). The conductive pad 12 is electrically connected to the conductive layer 115.

The conductive layer 17 is disposed on the conductive pad 12. The conductive pad 17 covers the conductive pad 12.

The conductive layer 17 includes a conductive layer 171 and a conductive layer 172. The conductive layer 171 is disposed on the conductive pad 12. The conductive layer 171 covers the conductive pad 12. The conductive layer 171 is in direct contact with the conductive pad 12. The conductive layer 171 surrounds a portion of the conductive pad 12.

The conductive layer 171 may include, for example but is not limited to, copper or other suitable material(s).

The conductive layer 172 is disposed on the conductive layer 171. The conductive layer 172 covers the conductive pad 171. The conductive layer 172 is in direct contact with the conductive layer 171. The conductive layer 172 is in direct contact with passivation layer 14. The conductive layer 172 is in direct contact with the protection layer 15. The conductive layer 172 is in direct contact with the connection element 16. The conductive layer 172 is in direct contact with the UBM structure 13. The conductive layer 172 is in direct contact with a conductive layer 131 of the UBM structure 13. The conductive layer 172 is in direct contact with a conductive layer 132 of the UBM structure 13. The conductive layer 172 is disposed on a sidewall of the passivation layer (or patterned passivation layer) 14.

The conductive layer 172 may include, for example but is not limited to, titanium (Ti) or other suitable material(s).

The passivation layer (or patterned passivation layer) 14 is disposed on the conductive layer 172.

The passivation layer 14 is disposed on the conductive layer 17. The passivation layer 14 covers the conductive layer 17. The passivation layer 14 covers a portion of the conductive layer 17.

The protection layer 15 is disposed on the conductive layer 17. The protection layer 15 is disposed on the conductive layer 171. The protection layer 15 is disposed on the conductive layer 172. The protection layer 15 is in direct contact with the conductive layer 17. The protection layer 15 is in direct contact with the conductive layer 171. The protection layer 15 is in direct contact with the conductive layer 172. The protection layer 15 is in direct contact with the passivation layer 14. The protection layer 15 is direct contact with a sidewall of the passivation layer (or patterned passivation layer) 14. The protection layer 15 is direct contact with the connection element 16.

The protection layer 15 may include, for example but is not limited to, anti-etching material(s), solder mask or solder resist material(s) or the like. The protection layer 15 may include material which is not removed or etched by nitric acid. The protection layer 15 may include conductive material. The protection layer 15 may include metal. The protection layer 15 may include metal oxide. The protection layer 15 may include, for example but is not limited to, titanium oxide (e.g. TiO, $Ti_2O_3$, $Ti_3O_5$ and $TiO_2$).

The protection layer 15 has a surface 15s1. The surface 15s1 is coplanar with a surface 14s1 of the passivation layer 14.

The UBM structure 13 is disposed on the conductive layer 17. The UBM structure 13 is disposed on the conductive layer 172. The UBM structure 13 is in direct contact with the conductive layer 17. The UBM structure 13 is in direct contact with the conductive layer 172. The UBM structure 13 is surrounded by the conductive layer 17. The UBM structure 13 is surrounded by the conductive layer 171. The UBM structure 13 is surrounded by the conductive layer 172.

The UBM structure 13 includes conductive layers 131 and 132.

The conductive layer 132 is disposed on the conductive layer 17. The conductive layer 132 is disposed on the conductive layer 172. The conductive layer 132 is surrounded by the conductive layer 17. The conductive layer 132 is in direct contact with the conductive layer 17. The conductive layer 132 is in direct contact with the conductive layer 172.

The conductive layer 132 may include, for example but is not limited to, copper or other suitable material(s).

The conductive layer 131 is disposed on the conductive layer 132. The conductive layer 131 is surrounded by the conductive layer 17. The conductive layer 131 is in direct contact with the conductive layer 17. The conductive layer 131 is in direct contact with the conductive layer 172.

The conductive layer 131 may include, for example but is not limited to, nickel or other suitable material(s). The conductive layer 131 may include intermetallic compound (IMC). The conductive layer 131 may include $Ni_3Sn_4$.

The connection element 16 is disposed on the UBM structure 13. The connection element 16 covers the UBM structure 13. The connection element 16 is in direct contact with the UBM structure 13. The connection element 16 is in direct contact with the conductive layer 131. The connection element 16 is in direct contact with the conductive layer 172. The connection element 16 is surrounded by the conductive layer 172. The connection element 16 is surrounded by the conductive layer 171. The connection element 16 is surrounded by the conductive layer 17.

The connection element 16 covers a portion of the protection layer 15. The connection element 16 covers the protection layer 15. The connection element 16 is in direct contact with the protection layer 15.

The connection element 16 may include, for example but is not limited to, solder or other suitable material(s). The connection element 16 may include, for example but is not limited to, gold, solder, tin, nickel or other suitable material(s). The connection element 16 may include an alloy of gold and tin solder. The connection element 16 may include an alloy of silver and tin solder. The connection element 16 may include, for example but is not limited to, $(Ni, Au)_3Sn_2$ or other suitable material(s).

Figure 1B:
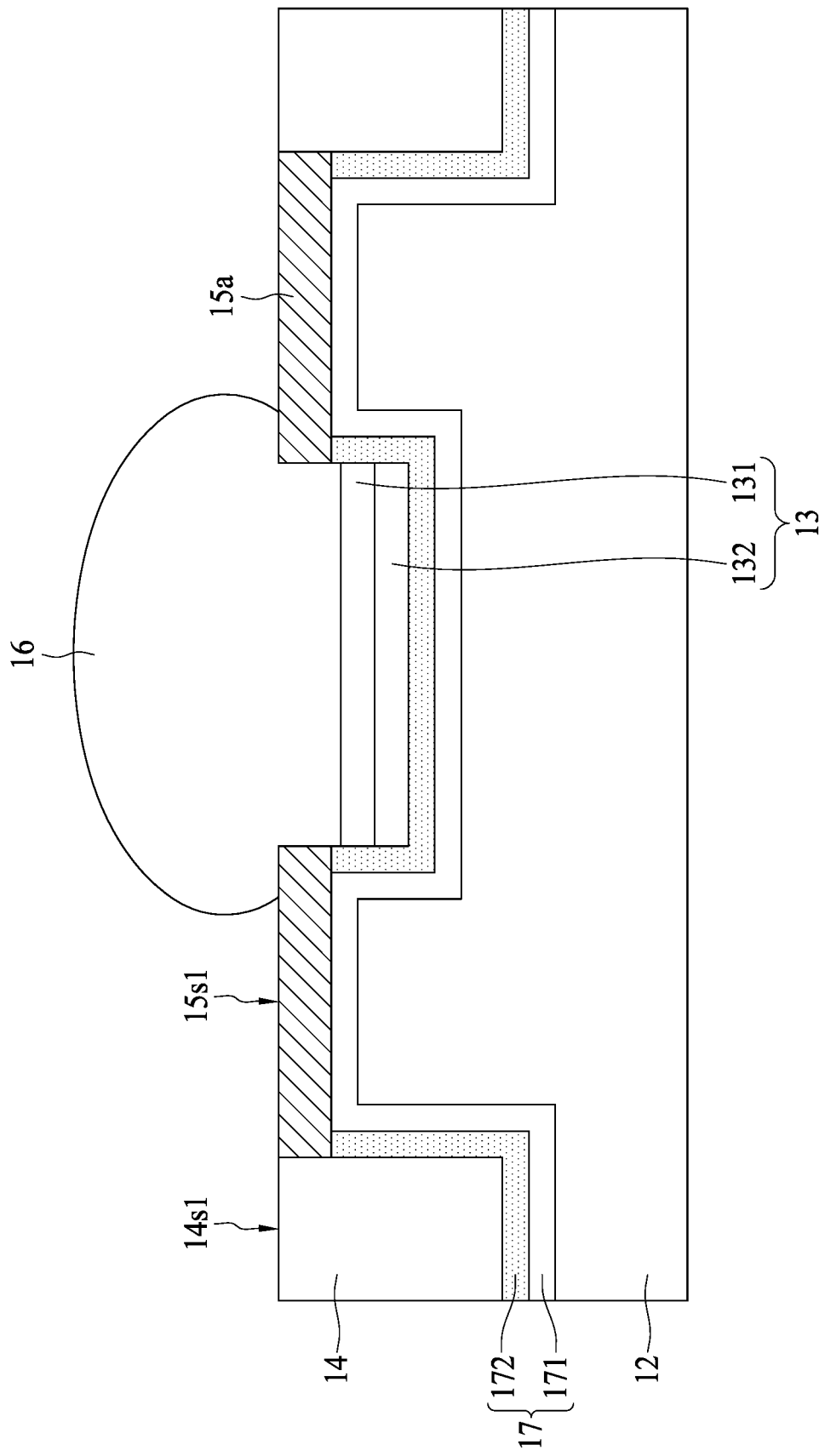
FIG. 1B illustrates an enlarged view of a portion of the semiconductor package in a box A shown in FIG. 1A in accordance with some embodiments of the subject application.

FIG. 1B illustrates an enlarged view of a portion of the semiconductor package 1 in a box A as shown in FIG. 1A in accordance with some embodiments of the subject application.

Referring to FIG. 1B, the protection layer 15 may include a single layer structure 15a. The protection layer 15a may include, for example but is not limited to, anti-etching material(s), solder mask or solder resist material(s) or the like. The protection layer 15a may include material which is not removed or etched by nitric acid. The protection layer 15 may include metal oxide. The protection layer 15 may include, for example but is not limited to, titanium oxide (e.g. TiO, $Ti_2O_3$, $Ti_3O_5$ and $TiO_2$).

Figure 1C:
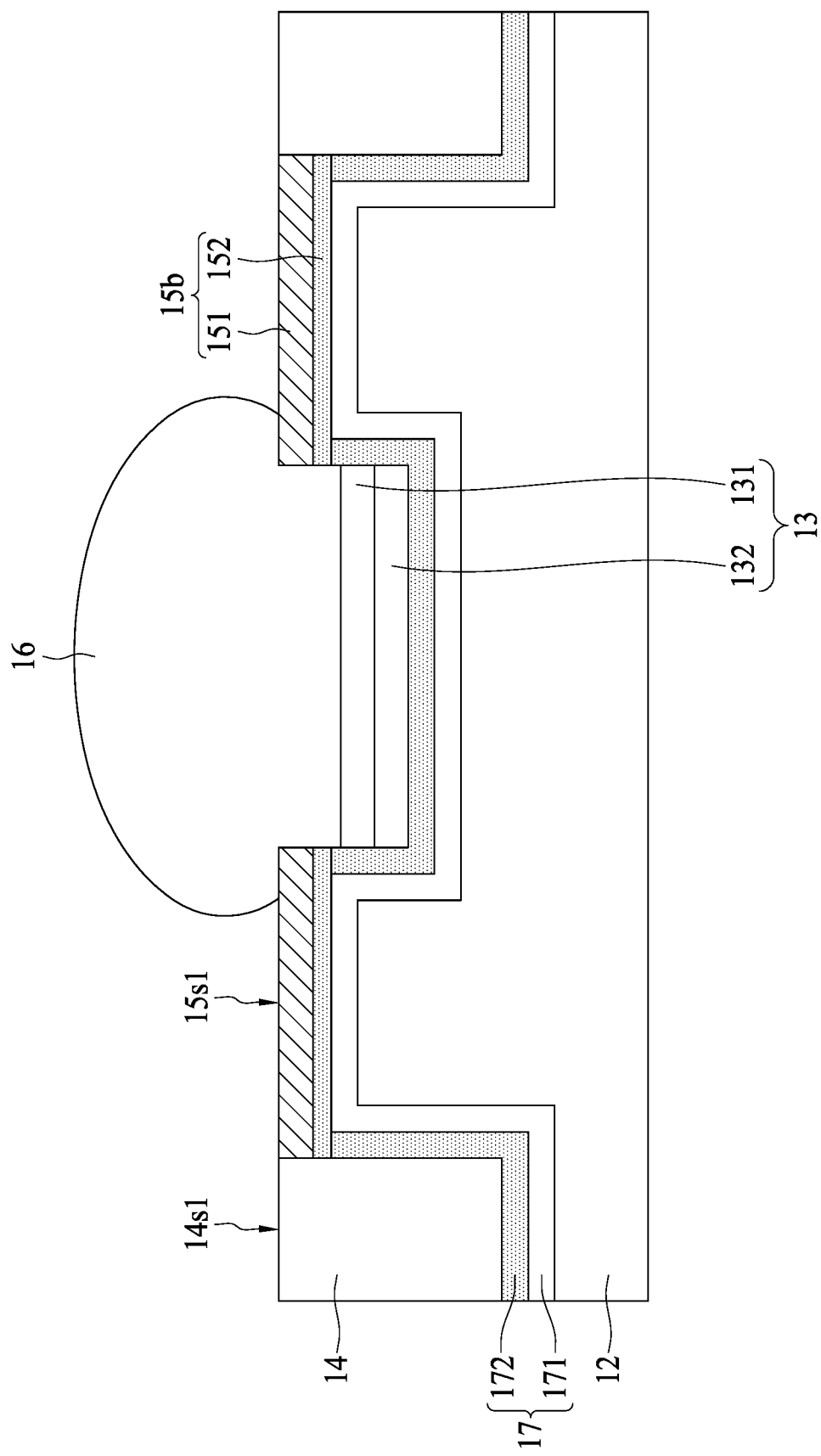
FIG. 1C illustrates an enlarged view of a portion of the semiconductor package in a box A shown in FIG. 1A in accordance with some embodiments of the subject application.

FIG. 1C illustrates an enlarged view of a portion of the semiconductor package 1 in a box A as shown in FIG. 1A in accordance with some embodiments of the subject application.

Referring to FIG. 1C, the protection layer 15 may include a multi-layer structure 15b.

The protection layer 15b includes a layer 151 and a layer 152. The layer 151 may include, for example but is not limited to, anti-etching material(s), solder mask or solder resist material(s) or the like. The layer 151 may include material which is not removed or etched by nitric acid. The layer 152 may include conductive material. The layer 152 may include metal. The layer 152 may include, for example but is not limited to, titanium (Ti) or other suitable material(s). The layer 151 may include metal oxide. The layer 151 may include, for example but is not limited to, titanium oxide (e.g. TiO, $Ti_2O_3$, $Ti_3O_5$ and $TiO_2$).

The layer 152 is disposed on the conductive pad 12. The layer 152 is disposed on the conductive layer 17. The layer 152 covers a portion of the conductive layer 17. The layer 152 is in direct contact with the conductive layer 17. The layer 152 is in direct contact with the conductive layer 171. The layer 152 is in direct contact with the conductive layer 172.

The layer 152 may include material same or similar to the conductive layer 172.

The protection layer 151 has a surface 15s1. The surface 15s1 of the protection layer is coplanar with a surface 14s1 of the passivation layer 14.

Figure 2A:
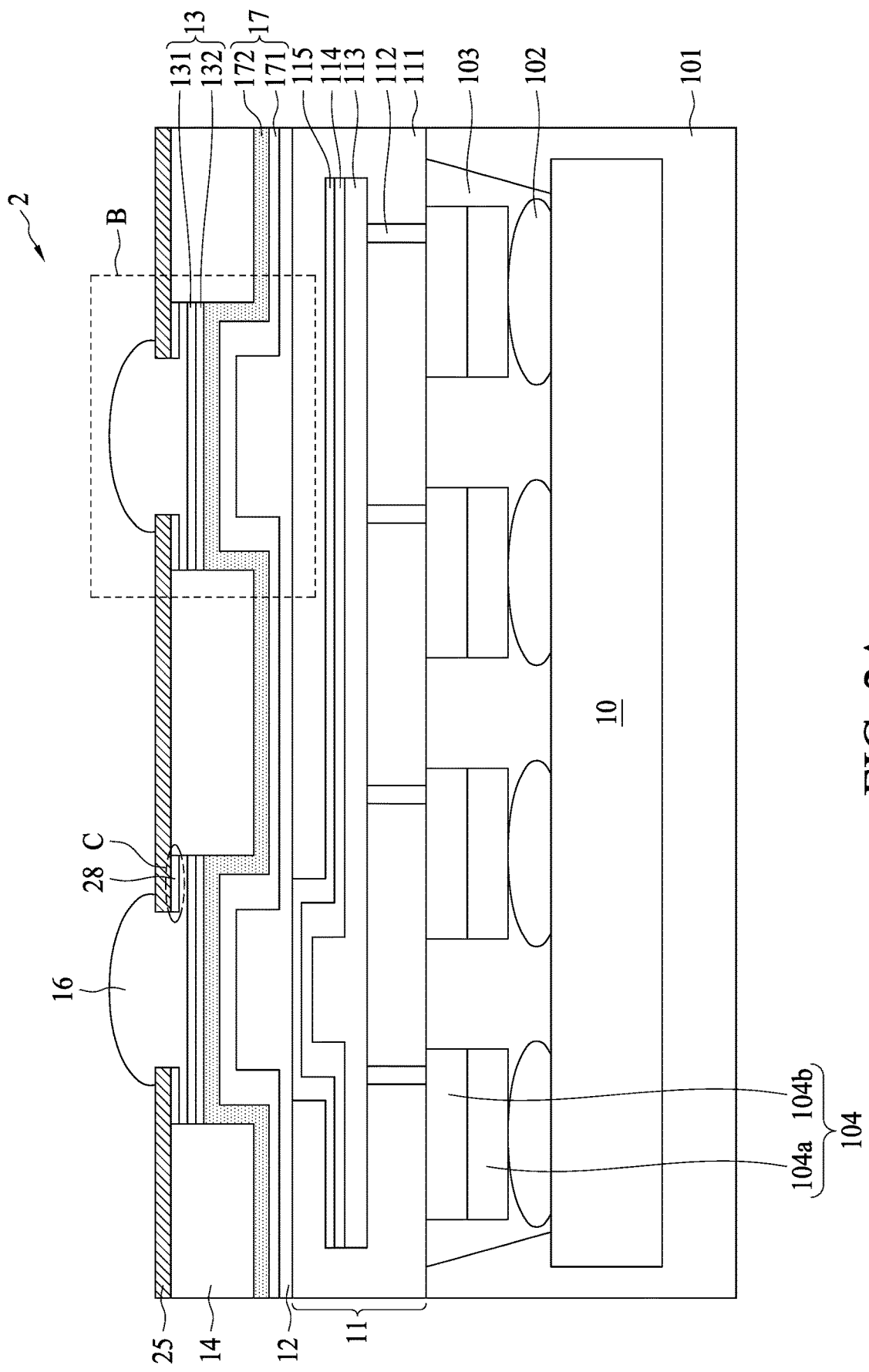
FIG. 2A illustrates cross-sectional view of a semiconductor device package in accordance with some embodiments of the subject application.

FIG. 2A illustrates cross-sectional view of a semiconductor device package in accordance with some embodiments of the subject application.

Referring to FIG. 2A, the semiconductor device package 2 includes a semiconductor device 10, a redistribution layer 11, a conductive pad 12, under bump metallurgy (UBM) structures 13, a passivation layer (or patterned passivation layer) 14, protection layers 25 and 28 and connection elements 16.

The semiconductor device 10 may include, for example but is not limited to, a semiconductor die (or chip) having circuit integrated therein or the like. Although a single semiconductor device 10 is illustrated in FIG. 2A, it is contemplated that the semiconductor device package 2 may include more device(s) or component(s).

The semiconductor device 10 is electrically connected to the redistribution layer 11 via the connection elements 102 and UBM structures 104.

The connection elements 102 may include solder, copper or other suitable material(s). The connection elements 102 may include an alloy of gold and tin solder. The connection elements 102 may include an alloy of silver and tin solder.

The UBM structure 104 includes conductive layers 104*a* and 104*b*. The conductive layer 104*a* is disposed on the connection element 102. The conductive layer 104*a* may include, for example but is not limited to, copper or other suitable conductive material. The conductive layer 104*b* is disposed on the conductive layer 104*a*. The conductive layer 104*b* may include, for example but is not limited to, nickel or other suitable conductive or barrier material. The conductive layer 104*b* may include intermetallic compound (IMC), for example but is not limited to, $Ni_3Sn_4$.

An underfill or encapsulant 103 is disposed between the semiconductor device 10 and the redistribution layer 11. The underfill or encapsulant 103 covers or encapsulates the connection elements 102. The underfill or encapsulant 103 covers or encapsulates the UBM structures 104. The encapsulant 103 may include epoxy. The encapsulant 103 may include fillers or particles.

An encapsulant 101 is disposed on the redistribution layer 11. The encapsulant 101 covers or encapsulates the semiconductor device 10. The encapsulant 101 covers or encapsulates the connection element 102. The encapsulant 101 covers or encapsulates the UBM structures 104. The encapsulant 101 may include epoxy. The encapsulant 101 may include fillers or particles.

The redistribution layer 11 includes a dielectric layer 111, conductive interconnections (e.g. through-vias) 112 and patterned conductive layers 113, 114, 115.

The conductive interconnections 112 are disposed on the UBM structures 104. Each of the conductive interconnections 112 is disposed on a UBM structure 104. The conductive interconnections 112 are electrically connected to the semiconductor device 10.

The patterned conductive layer 113 is disposed on the conductive interconnections 112. The patterned conductive layer 114 is disposed on the patterned conductive layer 113. The patterned conductive layer 115 is disposed on the patterned conductive layer 114.

The patterned conductive layer 113 may include, for example but is not limited to, copper or other suitable material(s). The patterned conductive layer 114 may include, for example but is not limited to, copper or other suitable material(s). The patterned conductive layer 115 may include, for example but is not limited to, titanium or other suitable material(s). The patterned conductive layers 114 and 115 may function as a seed layer during manufacture.

The dielectric layer 111 is disposed on a surface 10*s*.

The conductive pad 12 is disposed on the redistribution layer 11. The conductive pad 12 may include, for example but is not limited to, copper or other suitable material(s). The conductive pad 12 is electrically connected to the conductive layer 115.

The conductive layer 17 includes a conductive layer 171 and a conductive layer 172. The conductive layer 171 is disposed on the conductive pad 12. The conductive layer 171 covers the conductive pad 12. The conductive layer 171 is in direct contact with the conductive pad 12. The conductive layer 171 surrounds a portion of the conductive pad 12.

The conductive layer 171 may include, for example but is not limited to, copper or other suitable material(s).

The conductive layer 172 is disposed on the conductive layer 171. The conductive layer 172 covers the conductive pad 171. The conductive layer 172 is in direct contact with the conductive layer 171. The conductive layer 172 is in direct contact with passivation layer 14. The conductive layer 172 is in direct contact with the UBM structure 13. The conductive layer 172 is in direct contact with a conductive layer 132 of the UBM structure 13. The conductive layer 172 is disposed on a sidewall of the passivation layer (or patterned passivation layer) 14.

The conductive layer 172 may include, for example but is not limited to, titanium (Ti) or other suitable material(s).

The passivation layer (or patterned passivation layer) 14 is disposed on the conductive layer 172.

The passivation layer 14 is disposed on the conductive layer 17. The passivation layer 14 covers the conductive layer 17. The passivation layer 14 covers a portion of the conductive layer 17.

The protection layer 25 is disposed on the passivation layer 14. The protection layer 25 is in direct contact with the passivation layer (or patterned passivation layer) 14. The protection layer 25 is direct contact with the connection element 16. The protection layer 25 is direct contact with the protection layer 28. The protection layer 25 extends over the passivation layer 14.

The protection layer 25 may include, for example but is not limited to, anti-etching material(s), solder mask or solder resist material(s) or the like. The protection layer 25 may include material which is not removed or etched by nitric acid. The protection layer 25 may include conductive material. The protection layer 25 may include metal. The protection layer 25 may include metal oxide. The protection layer 25 may include, for example but is not limited to, tantalum oxide (e.g. $Ta_2O_5$ and $TaO_2$).

The protection layer 28 is disposed under the protection layer 25. The protection layer 28 is disposed under the extended portion of the protection layer 25. The protection layer 28 is disposed on a sidewall of the passivation layer 14. The protection layer 28 is in direct contact with the protection layer 28. The protection layer 28 is in direct contact with the passivation layer 14.

The protection layer 28 may include metal. The protection layer 28 may include, for example but is not limited to, nickel or other suitable material. The protection layer 28 may include metal oxide. The protection layer 28 may include, for example but is not limited to, nickel oxide (NiO) or other suitable material. The protection layer 28 may include intermetallic compound (IMC). The protection layer 28 may include $Ni_3Sn_4$.

The UBM structure 13 is disposed on the conductive layer 17. The UBM structure 13 is disposed on the conductive layer 172. The UBM structure 13 is in direct contact with the conductive layer 17. The UBM structure 13 is in direct contact with the conductive layer 172. The UBM structure 13 is in direct contact with the connection element 16. The UBM structure 13 is surrounded by the passivation layer 14.

The UBM structure 13 includes a conductive layer 131 and a conductive layer 132.

The conductive layer 132 is disposed on the conductive layer 17. The conductive layer 132 is disposed on the conductive layer 172. The conductive layer 132 is surrounded by the passivation layer 14. The conductive layer 132 is in direct contact with the conductive layer 17. The conductive layer 132 is in direct contact with the conductive layer 172. The conductive layer 132 is in direct contact with the passivation layer 14.

The conductive layer 132 may include, for example but is not limited to, copper or other suitable material(s).

The conductive layer 131 is disposed on the conductive layer 132. The conductive layer 131 is surrounded by the passivation layer 14. The conductive layer 131 is in direct contact with the passivation layer 14.

The conductive layer 131 may include, for example but is not limited to, nickel or other suitable material(s). The conductive layer 131 may include intermetallic compound (IMC). The conductive layer 131 may include $Ni_3Sn_4$.

The connection element 16 is disposed on the UBM structure 13. The connection element 16 covers the UBM structure 13. The connection element 16 covers the protection layer 25. The connection element 16 is in direct contact with the UBM structure 13. The connection element 16 is in direct contact with the conductive layer 131. The connection element 16 is surrounded by the passivation layer 14. The connection element 16 is surrounded by the protection layer 28. The connection element 16 is surrounded by the protection layer 25. The connection element 16 is in direct contact with the passivation layer 14. The connection element 16 is in direct contact with the protection layer 28. The connection element 16 is in direct contact with the protection layer 25. The connection element 16 is disposed between the protection layer 28 and the UBM structure 13.

The connection element 16 covers a portion of the protection layer 25. The connection element 16 covers the protection layer 25.

The connection element 16 may include, for example but is not limited to, solder or other suitable material(s). The connection element 16 may include, for example but is not limited to, gold, solder, tin, nickel or other suitable material(s). The connection element 16 may include an alloy of gold and tin solder. The connection element 16 may include an alloy of silver and tin solder. The connection element 16 may include, for example but is not limited to, $(Ni, Au)_3Sn_2$ or other suitable material(s).

Figure 2B:
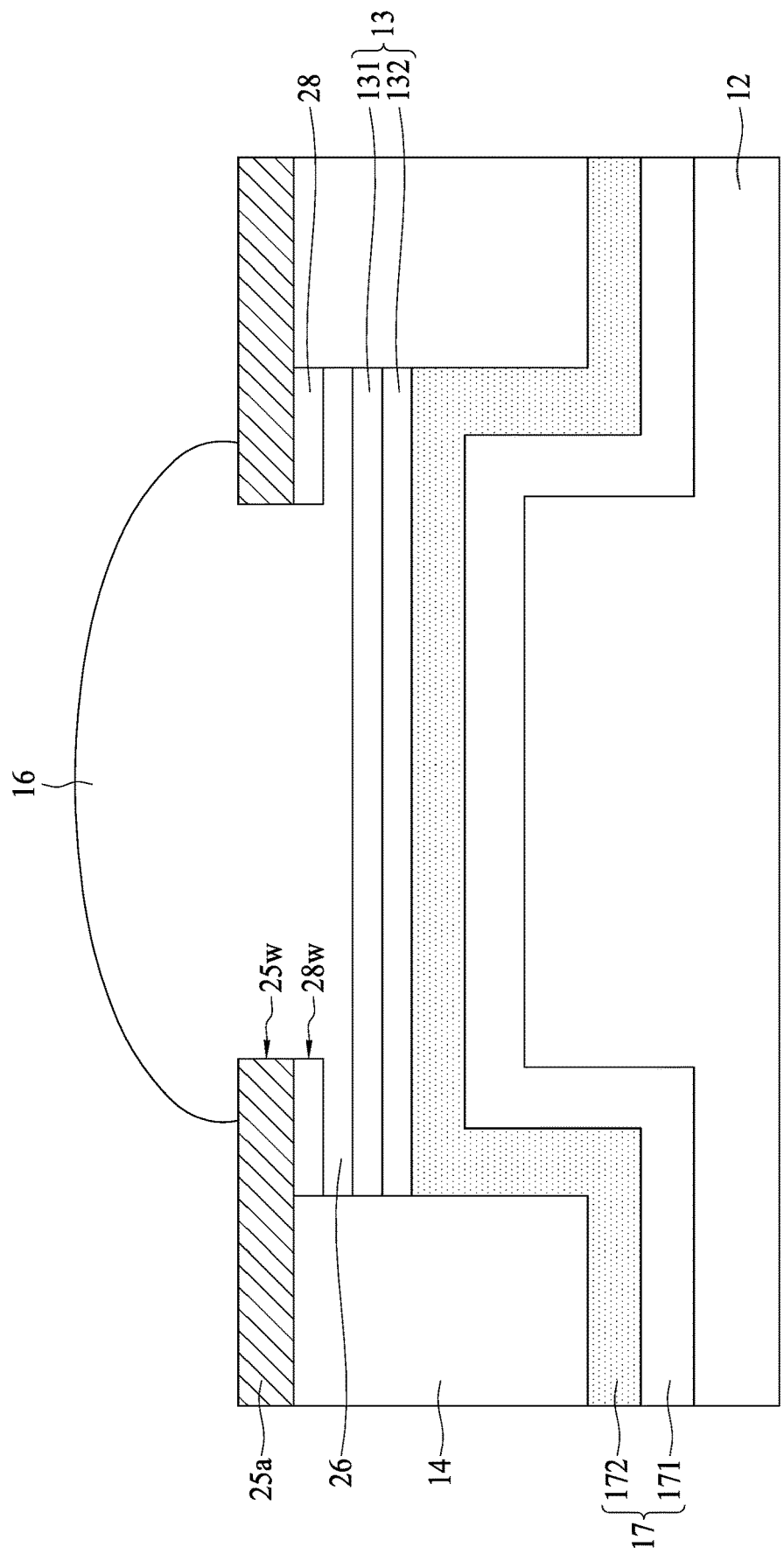
FIG. 2B illustrates an enlarged view of a portion of the semiconductor package in a box B shown in FIG. 2A in accordance with some embodiments of the subject application.

FIG. 2B illustrates an enlarged view of a portion of the semiconductor package 2 in a box B as shown in FIG. 2A in accordance with some embodiments of the subject application.

Referring to FIG. 2B, the protection layer 25 may include a single layer structure 25a. The protection layer 25a has a sidewall 25w. The protection layer 28 has a sidewall 28w. The sidewall 25w of the protection layer 28 is substantially coplanar with the sidewall 28w of the protection layer 28.

The protection layer 25a may include, for example but is not limited to, anti-etching material(s), solder mask or solder resist material(s) or the like. The protection layer 25a may include material which is not removed or etched by nitric acid. The protection layer 25a may include metal oxide. The protection layer 25 may include, for example but is not limited to, tantalum oxide (e.g. $Ta_2O_5$ and $TaO_2$).

Figure 2C:
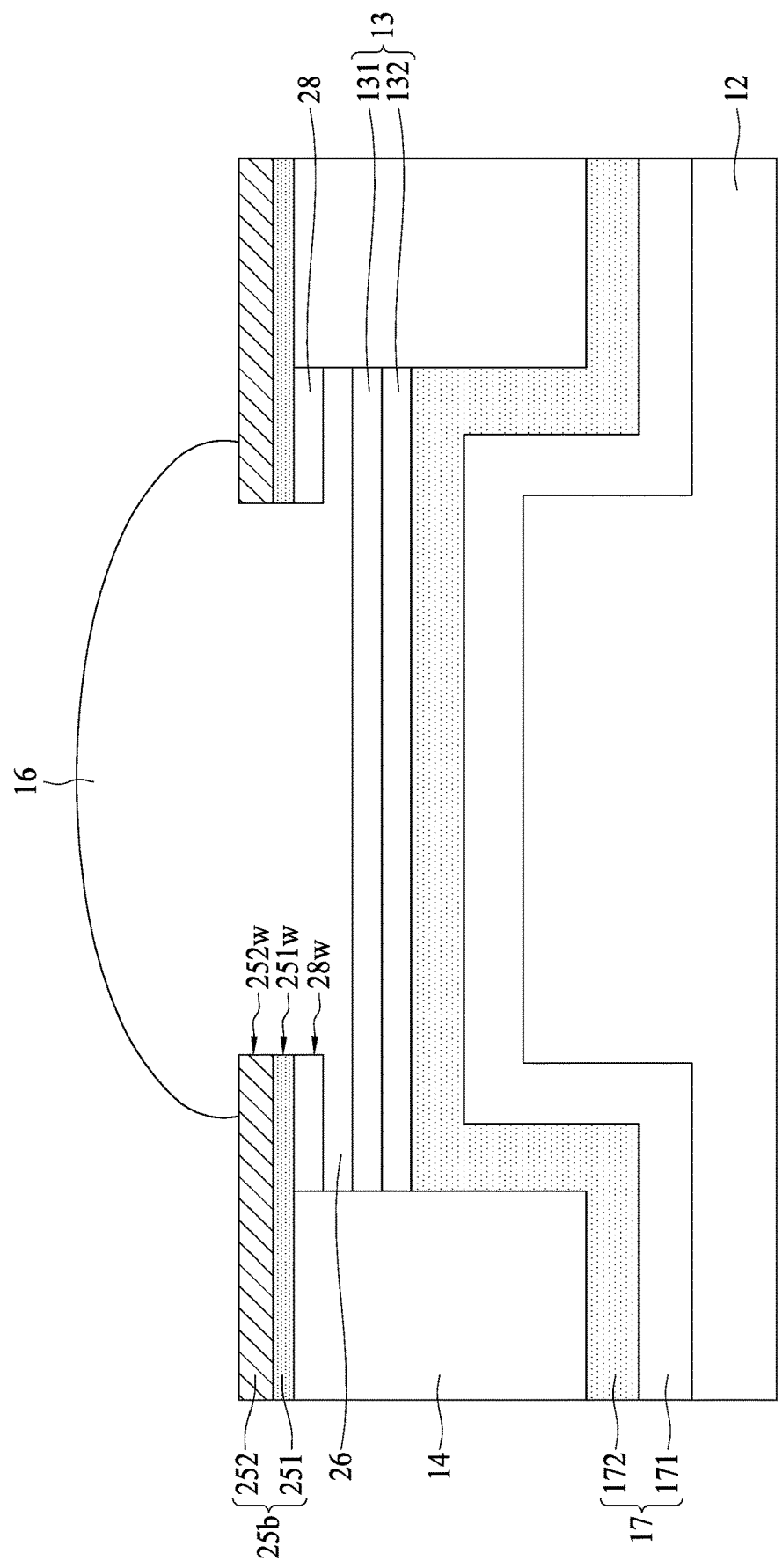
FIG. 2C illustrates an enlarged view of a portion of the semiconductor package in a box B shown in FIG. 2A in accordance with some embodiments of the subject application.

FIG. 2C illustrates an enlarged view of a portion of the semiconductor package 2 in a box B as shown in FIG. 2A in accordance with some embodiments of the subject application.

Referring to FIG. 2C, the protection layer 25 may include a multi-layer structure 25b.

The protection layer 25b includes a layer 251 and a layer 252. The layer 252 may include, for example but is not limited to, anti-etching material(s), solder mask or solder resist material(s) or the like. The layer 252 may include material which is not removed or etched by nitric acid. The layer 252 may include metal oxide. The layer 252 may include, for example but is not limited to, tantalum oxide (e.g. $TaO_2$ and $Ta_2O_5$). The layer 251 may include conductive material. The layer 251 may include metal. The layer 251 may include, for example but is not limited to, tantalum (Ta) or other suitable material(s).

The layer 252 is disposed on the layer 251. The layer 251 is disposed on the passivation layer 14. The layer 251 is disposed on the protection layer 28. The layer 251 covers the passivation layer 14. The layer 251 is in direct contact with the passivation layer 14. The layer 251 is in direct contact with the protection layer 28.

The layer 251 has a sidewall 251w. The layer 252 has a sidewall 252w. The sidewall 251w of the layer 251 is coplanar with the sidewall 252w of the layer 252. The sidewall 251w of the layer 251 is coplanar with the sidewall 28w of the protection layer 28. The sidewall 252w of the layer 252 is coplanar with the sidewall 28w of the protection layer 28.

Figure 2D:
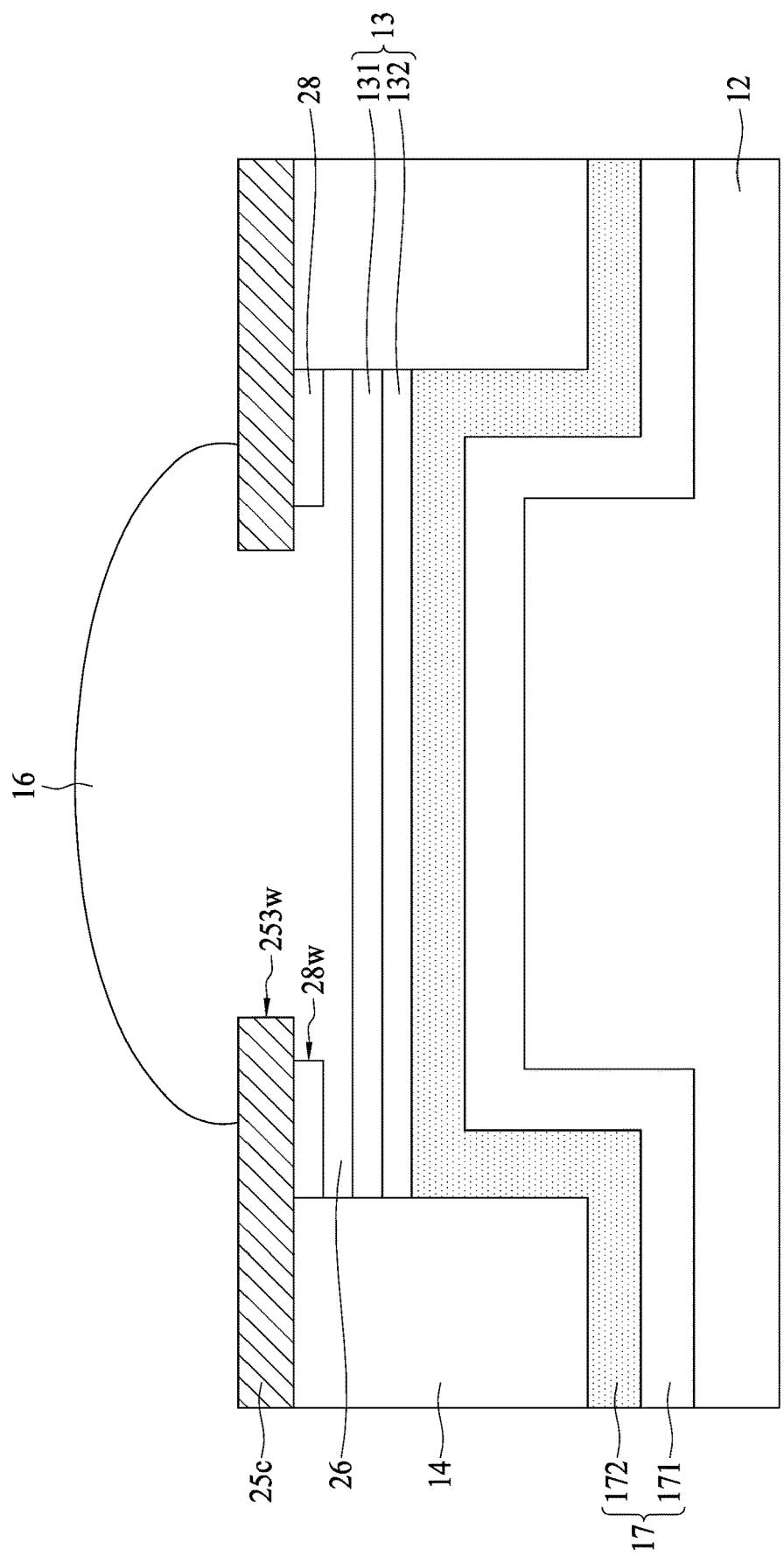
FIG. 2D illustrates an enlarged view of a portion of the semiconductor package in a box B shown in FIG. 2A in accordance with some embodiments of the subject application.

FIG. 2D illustrates an enlarged view of a portion of the semiconductor package 2 in a box B as shown in FIG. 2A in accordance with some embodiments of the subject application.

Referring to FIG. 2D, the protection layer 25 may include a single layer structure 25c. The layer 25c extends over the protection layer 28.

The protection layer 25c may include, for example but is not limited to, anti-etching material(s), solder mask or solder resist material(s) or the like. The protection layer 25c may include material which is not removed or etched by nitric acid. The protection layer 25c may include metal oxide. The protection layer 25c may include, for example but is not limited to, tantalum oxide (e.g. $Ta_2O_5$ and $TaO_2$).

Figure 2E:
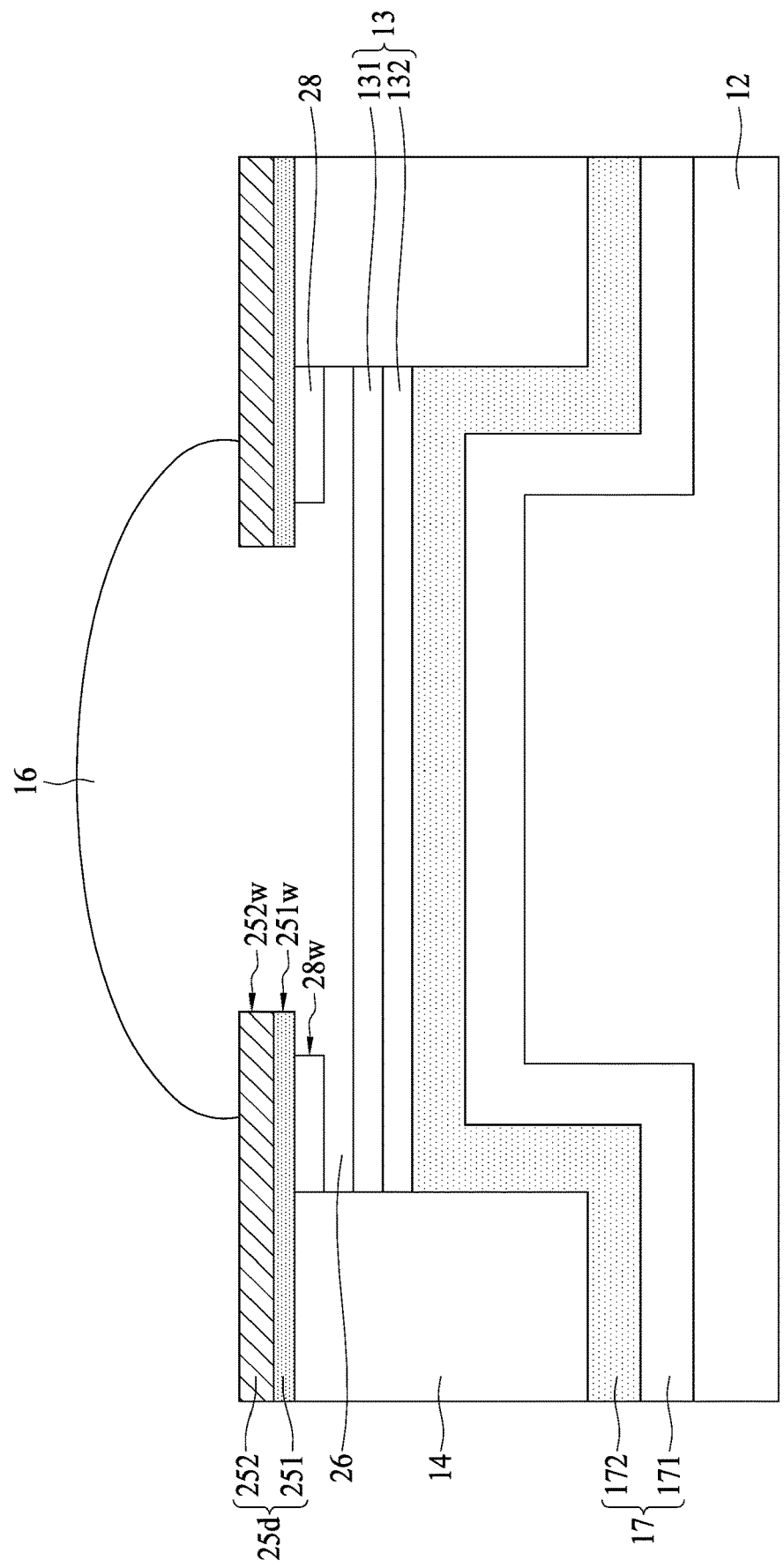
FIG. 2E illustrates an enlarged view of a portion of the semiconductor package in a box B shown in FIG. 2A in accordance with some embodiments of the subject application.

FIG. 2E illustrates an enlarged view of a portion of the semiconductor package 2 in a box B as shown in FIG. 2A in accordance with some embodiments of the subject application.

Referring to FIG. 2E, the protection layer 25 may include a multi-layer structure 25d.

The protection layer 25d includes a layer 251 and a layer 252. The layer 252 may include, for example but is not limited to, anti-etching material(s), solder mask or solder resist material(s) or the like. The layer 252 may include material which is not removed or etched by nitric acid. The layer 252 may include metal oxide. The layer 252 may include, for example but is not limited to, tantalum oxide (e.g. $TaO_2$ and $Ta_2O_5$). The layer 251 may include conductive material. The layer 251 may include metal. The layer 251 may include, for example but is not limited to, tantalum (Ta) or other suitable material(s).

The layer 252 is disposed on the layer 251. The layer 251 is disposed on the passivation layer 14. The layer 251 is disposed on the protection layer 28. The layer 251 covers the passivation layer 14. The layer 251 is in direct contact with the passivation layer 14. The layer 251 is in direct contact with the protection layer 28.

The layer 251 extends over the protection layer 28. The layer 252 extends over the protection layer 28. The layer 251 has a sidewall 251w. The layer 252 has a sidewall 252w. The sidewall 251w of the layer 251 is substantially coplanar with the sidewall 252w of the layer 252.

Figure 3A:
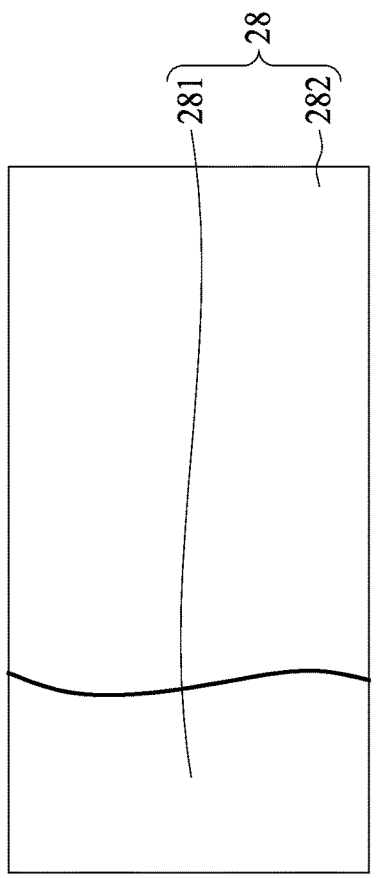
FIG. 3A illustrates an enlarged view of a portion of the semiconductor package in a circle C shown in FIG. 2A in accordance with some embodiments of the subject application.

FIG. 3A illustrates an enlarged view of a portion of the semiconductor package 2 in a circle C as shown in FIG. 2A in accordance with some embodiments of the subject application.

Referring to FIG. 3A, the protection layer 28 includes a multi-layer structure.

The protection layer 28 includes a layer 281, a layer 282 and a layer 283. The layer 281 is in direct contact with the protection layer 25. The layer 281 is in direct contact with the connection element 16. The layer 281 is in direct contact with the layer 282. The layer 281 is in direct contact with the layer 283. The layer 282 is in direct contact with the connection element 16. The layer 282 is in direct contact with the passivation layer 14. The layer 282 is in direct contact with the protection layer 25. The layer 282 is in direct contact with the layer 283. The layer 283 is in direct contact with the protection layer 25. The layer 283 is in direct contact with the passivation layer 14.

The layer 281 may include, for example but is not limited to, nickel oxide (NiO) or other suitable material. The layer 282 may include, for example but is not limited to, intermetallic compound (IMC) ($Ni_3Sn_4$). The layer 283 may include, for example but is not limited to, nickel or other suitable material.

Figure 3B:
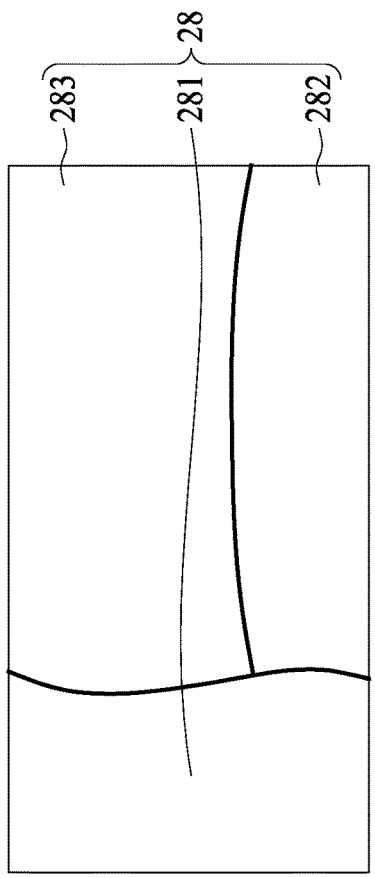
FIG. 3B illustrates an enlarged view of a portion of the semiconductor package in a circle C shown in FIG. 2A in accordance with some embodiments of the subject application.

FIG. 3B illustrates an enlarged view of a portion of the semiconductor package 2 in a circle B as shown in FIG. 2A in accordance with some embodiments of the subject application.

Referring to FIG. 3B, the protection layer 28 include a multi-layer structure.

The protection layer 28 includes a layer 281 and a layer 282. The layer 281 is in direct contact with the protection layer 25. The layer 281 is in direct contact with the connection element 16. The layer 282 is in direct contact with the protection layer 25. The layer 282 is in direct contact with the connection element 16. The layer 282 is in direct contact with the passivation layer 14.

The layer 281 may include, for example but is not limited to, nickel oxide (NiO) or other suitable material. The layer 282 may include, for example but is not limited to, intermetallic compound (IMC) ($Ni_3Sn_4$).

FIG. 4A, FIG. 4B, FIG. 4C, FIG. 4D, FIG. 4E, FIG. 4F, FIG. 4G, FIG. 4H, FIG. 4I, FIG. 4J, FIG. 4K, FIG. 4L and FIG. 4M illustrate operations of manufacturing a semiconductor device package in accordance with some embodiments of the subject application.

Figure 4A:
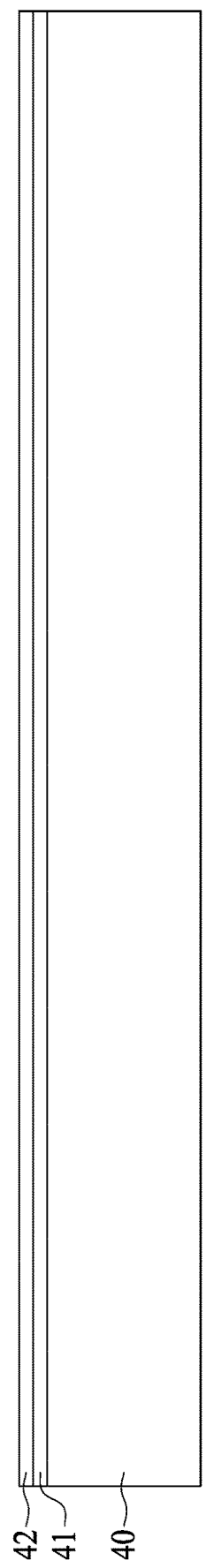
FIG. 4A, FIG. 4B, FIG. 4C, FIG. 4D, FIG. 4E, FIG. 4F, FIG. 4G, FIG. 4H, FIG. 4I, FIG. 4J, FIG. 4K, FIG. 4L and FIG. 4M illustrate operations of manufacturing a semiconductor device package in accordance with some embodiments of the subject application.

Referring to FIG. 4A, a carrier 40 is provided. A layer 41 is formed on the carrier 40. A layer 42 is formed on the layer 41.

The layer 41 may include, for example but is not limited to, titanium or other suitable material. The layer 42 may include, for example but is not limited to, copper or other suitable material.

The layer 41 may be formed by, for example but not limited to, chemical vapor deposited (CVD) technique or other suitable technique. The layer 42 may be formed by, for example but not limited to, chemical vapor deposited (CVD) technique or other suitable technique.

Figure 4B:
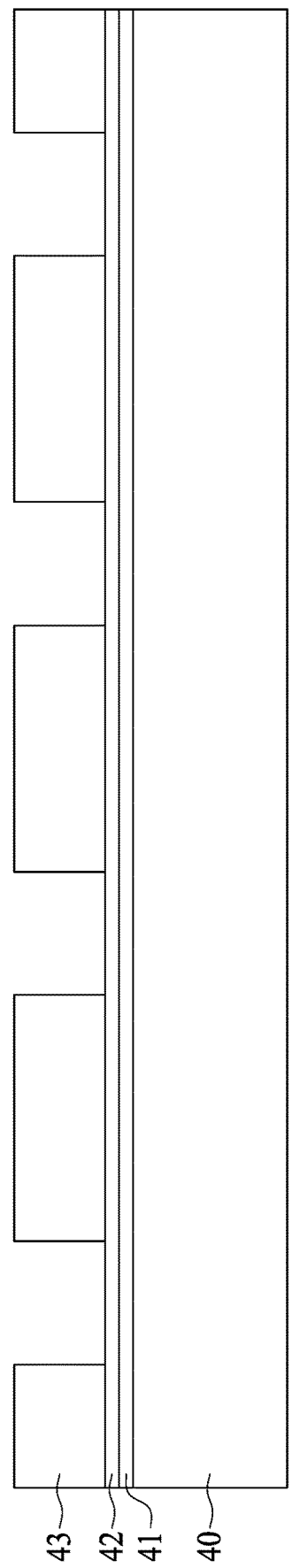

Referring to FIG. 4B, a patterned photo-sensitive material 43 is formed on the layer 42. A portion of the layer 42 is covered by the patterned photo-sensitive material 43. The patterned photo-sensitive material 43 may be formed by, for example but not limited to, a coating, lamination, or other suitable technique.

Figure 4C:
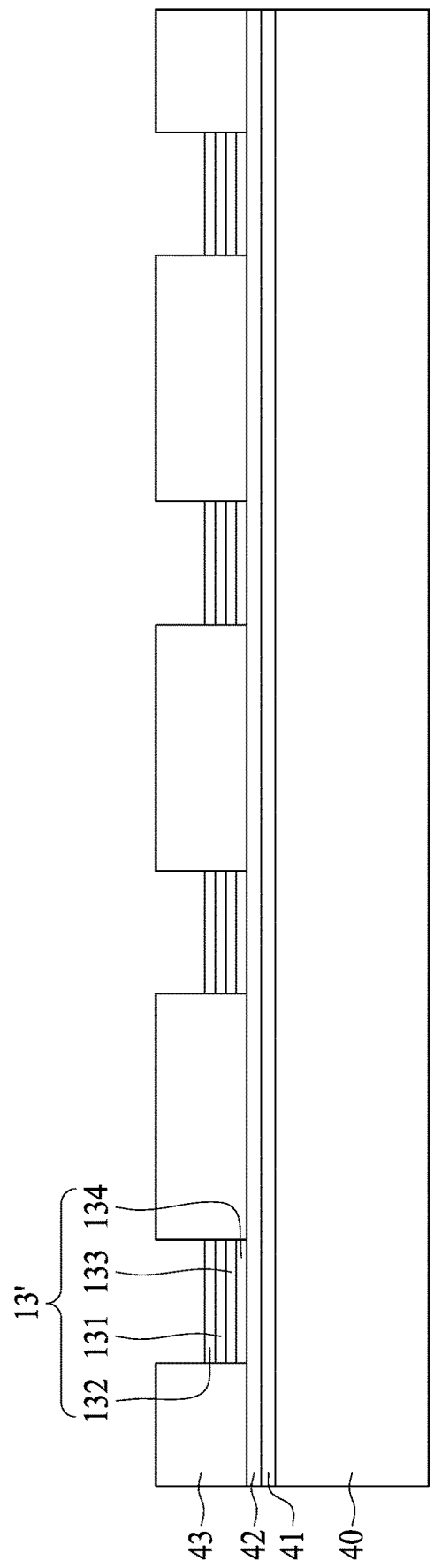

Referring to FIG. 4C, a UBM structure 13' is formed on the layer 42. The UBM structure 13' may include a multi-layer structure. The UBM structure 13' includes a conductive layer 131, a conductive layer 132, conductive layer 133 and a conductive layer 134.

The conductive layer 134 is formed on the layer 42. The conductive layer 133 is formed on the conductive layer 134. The conductive layer 131 is formed on the conductive layer 133. The conductive layer 132 is formed on the conductive layer 131. The conductive layer 134 may include, for example but is not limited to, nickel or other suitable material. The conductive layer 133 may include, for example but is not limited to, gold or other suitable material. The conductive layer 131 may include, for example but is not limited to, nickel or other suitable material. The conductive layer 132 may include, for example but is not limited to, copper or other suitable material.

Figure 4D:
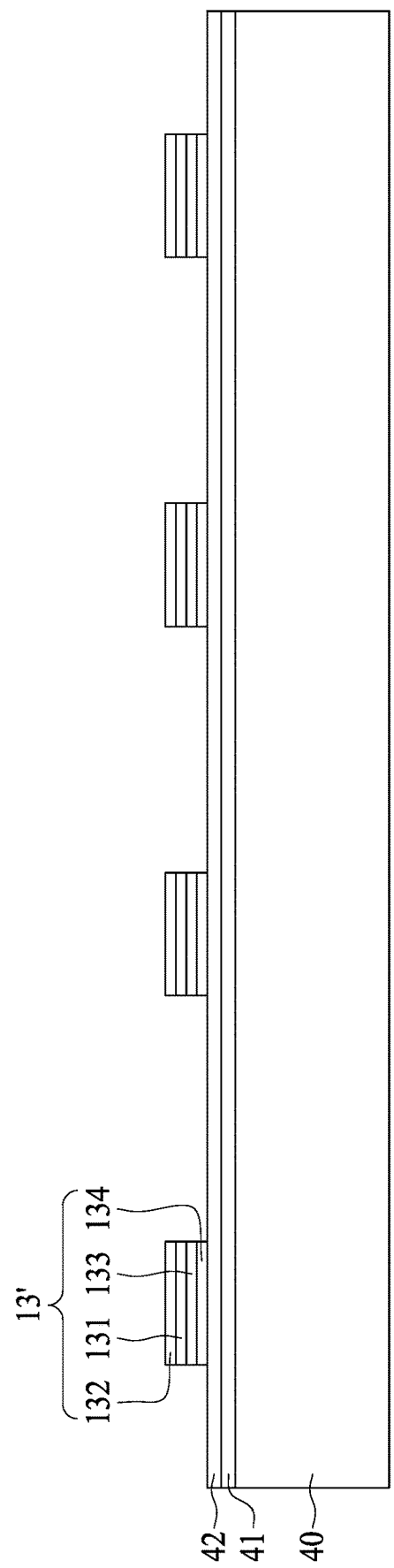

Referring to FIG. 4D, the patterned photo-sensitive materials 43 are removed.

Figure 4E:
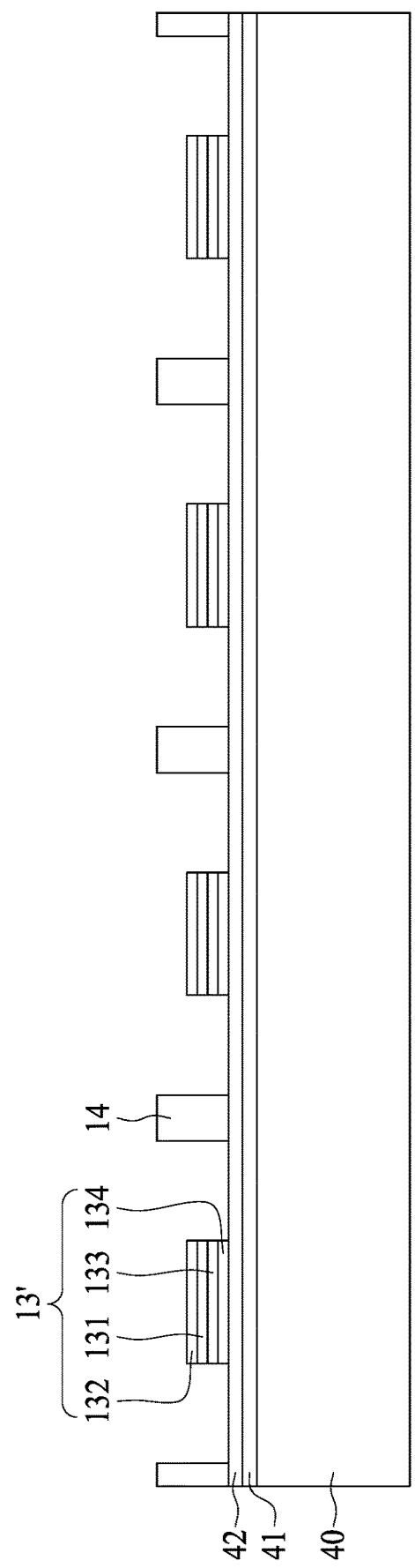

Referring to FIG. 4E, a patterned passivation layer 14 is formed on the layer 42.

Figure 4F:
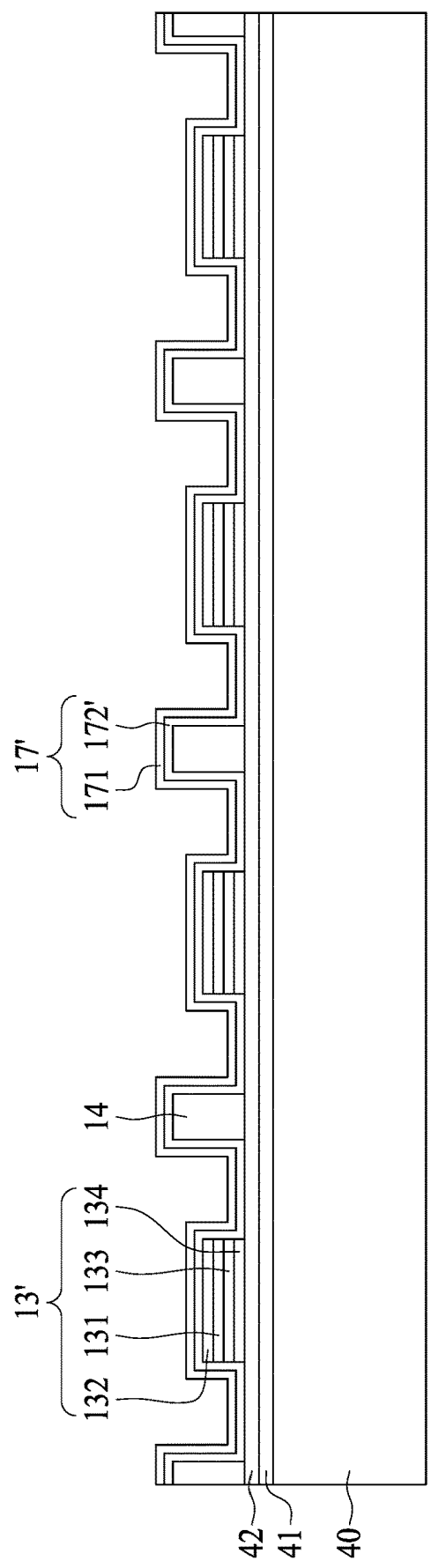

Referring to FIG. 4F, a conductive layer 17' is formed. The conductive layer 17' includes conductive layer 171 and conductive layer 172'.

The conductive layer 17' is formed on the passivation layer 14, the layer 42 and the UBM structure 13'. The conductive layer 17' covers the passivation layer 14, the layer 42 and the UBM structure 13'. The conductive layer 172' is formed on the passivation layer 14, the layer 42 and the UBM structure 13'. The conductive layer 171 is formed on the conductive layer 172'.

The conductive layer 172' may include, for example but is not limited to, titanium or other suitable material. The conductive layer 171 may include, for example but is not limited to, copper or other suitable material.

Figure 4G:
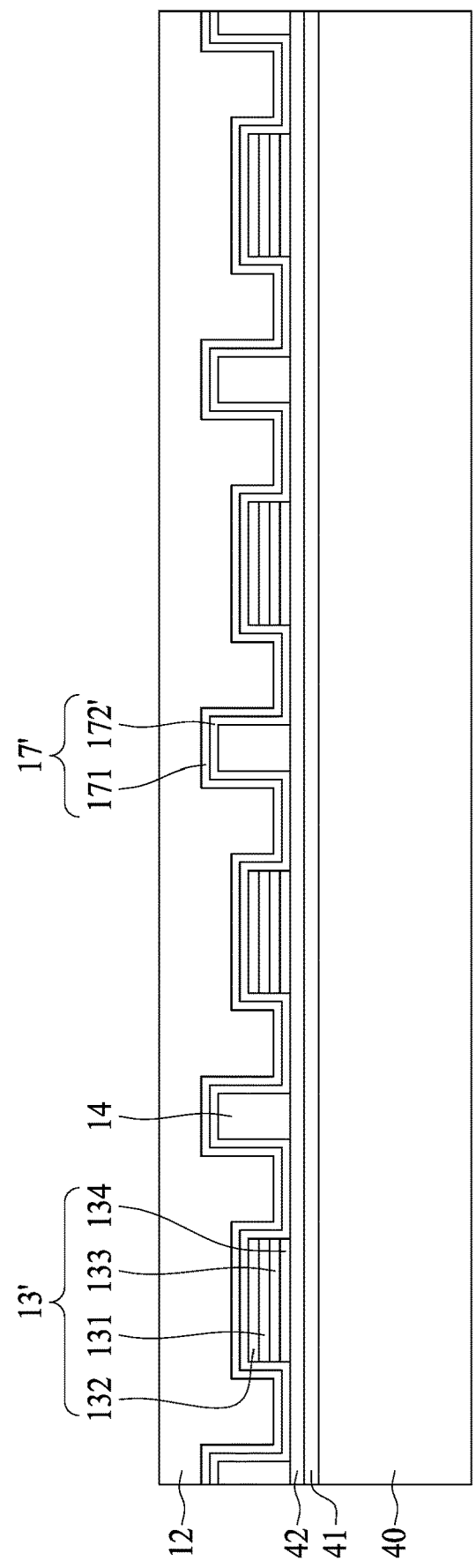

Referring to FIG. 4G, a conductive pad 12 is formed on the conductive layer 171. The conductive pad 12 may include, for example but is not limited to, copper or other suitable material.

Figure 4H:
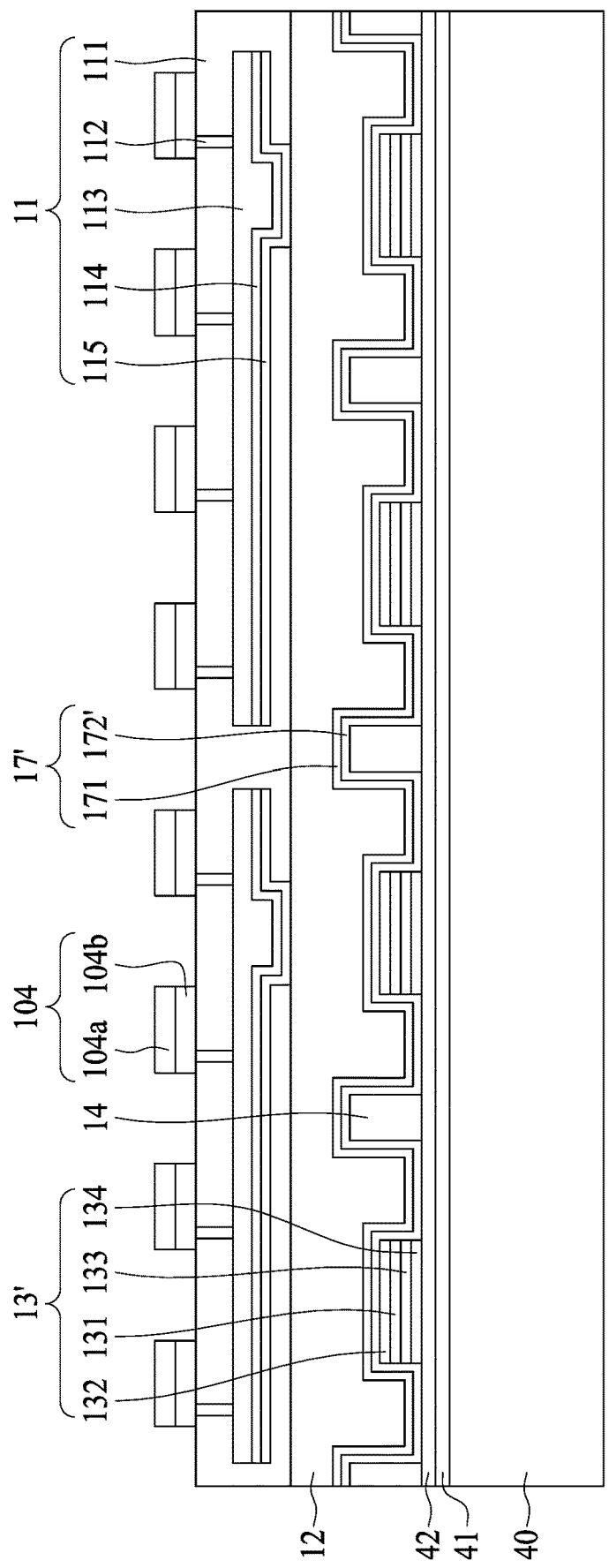

Referring to FIG. 4H, a redistribution layer 11 and UBM structures are formed. The redistribution layer 11 is formed on the conductive pad 12. UBM structures 104 are formed on the redistribution layer 11.

The redistribution layer 11 includes a dielectric layer 111, conductive interconnections (e.g. through-vias) 112 and patterned conductive layers 113, 114, 115. The dielectric layer 111 is formed on the conductive pad 12. The dielectric layer 111 exposes a portion of the conductive pad 12. The patterned conductive layer 115 is formed on the conductive pad 12 and the dielectric layer 111. The patterned conductive layer 114 is formed on the patterned conductive layer 115. The patterned conductive layer 113 is formed on the patterned conductive layer 114. The conductive interconnections 112 are formed on the patterned conductive layer 113. The dielectric layer 111 covers, surrounds or seals the conductive interconnections 112 and the patterned conductive layers 113, 114, 115. A portion of the conductive interconnections 112 is exposed by the dielectric layer 111. The conductive pad 12 is electrically connected to the conductive interconnections 112 through the patterned conductive layers 113, 114, 115.

The UBM structures 104 are formed on the redistribution layer 10. The UBM structures 104 are formed on the conductive interconnections 112. The UBM structures 104 include conductive layers 104a and 104b. The conductive layers 104b are formed on the redistribution layer 11. The conductive layers 104b are formed on the conductive interconnections 112. The conductive layers 104a are formed on the conductive layers 104b.

Figure 4I:
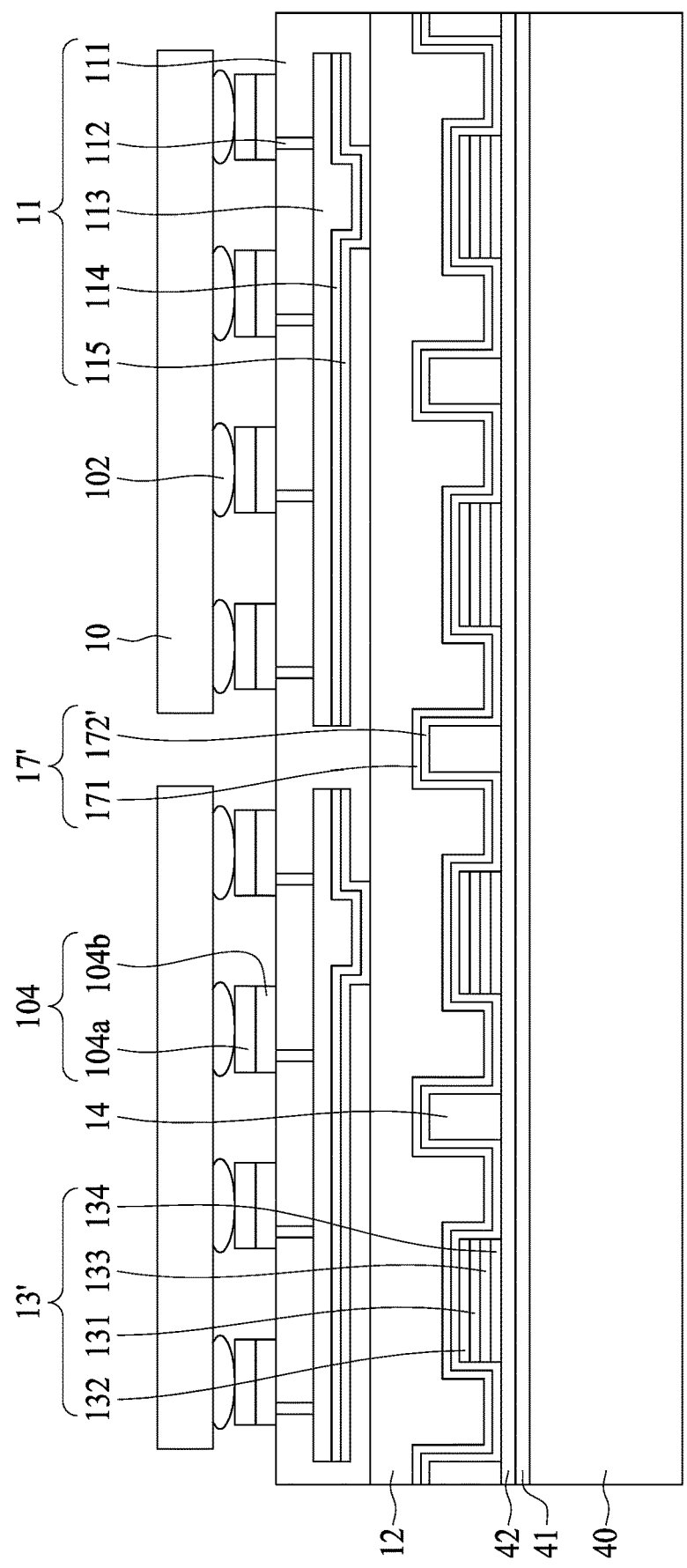

Referring to FIG. 4I, connection elements 102 are formed. Semiconductor devices 10 are disposed on the connection elements 102.

The connection elements 102 are formed on the UBM structures 104. The connection elements 102 are formed on the conductive layer 104a. The semiconductor devices 10 are disposed on the connection elements 102. The semiconductor devices 10 are electrically connected to the redistribution layer 11 through the connection elements 102 and the UBM structures 104.

The semiconductor devices 10 may be bonded to the redistribution layer 11, for example but not limited to, a flip-chip bonding technique.

Figure 4J:
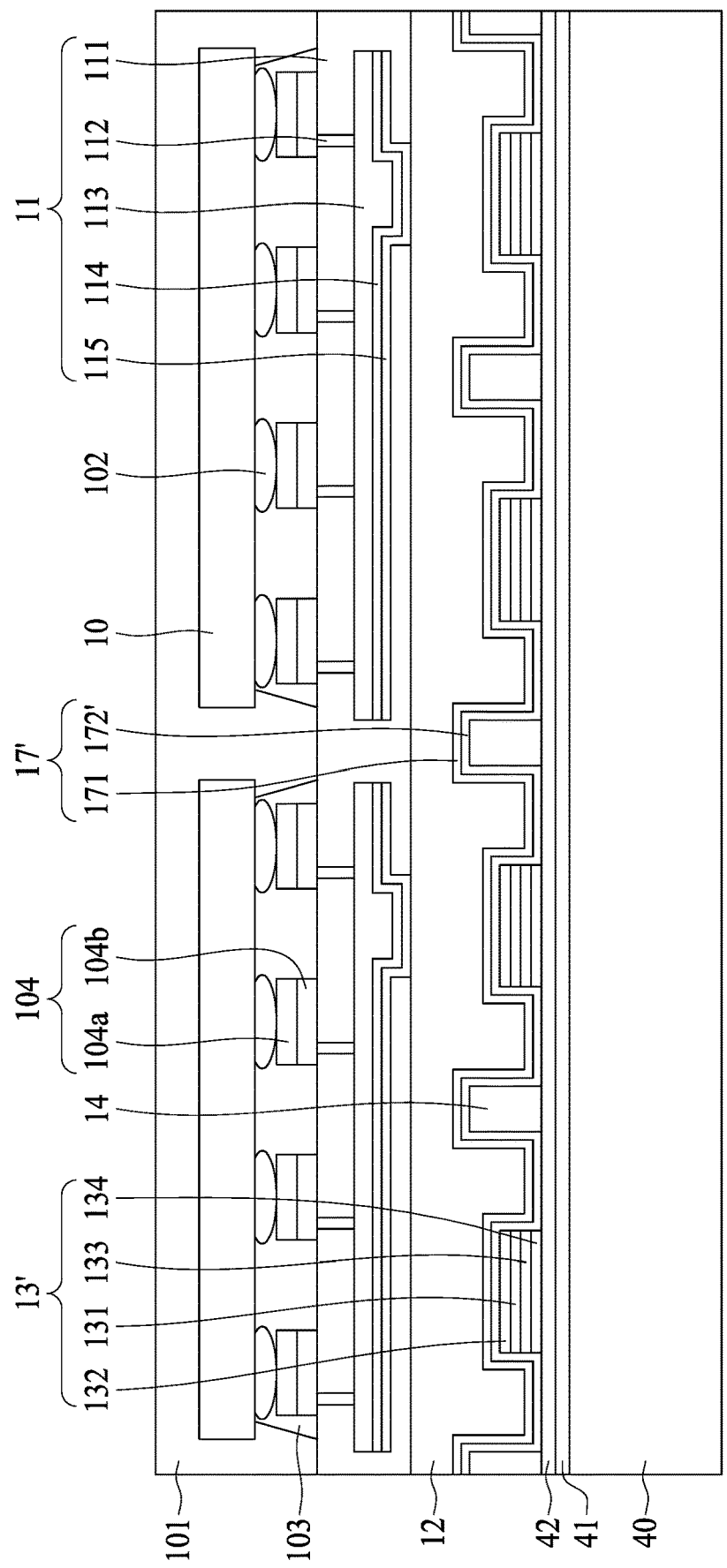

Referring to FIG. 4J, an underfill or encapsulant is disposed between the semiconductor device 10 and the redistribution layer 11. An encapsulant 101 is formed on the redistribution layer 11.

The underfill or encapsulant 103 covers or encapsulates the connection elements 102. The underfill or encapsulant 103 covers or encapsulates the UBM structures 104. The encapsulant 103 may include epoxy. The encapsulant 103 may include fillers or particles.

The encapsulant 101 covers or encapsulates the semiconductor device 10. The encapsulant 101 covers or encapsulates the connection element 102. The encapsulant 101 covers or encapsulates the UBM structures 104. The encapsulant 101 may include epoxy. The encapsulant 101 may include fillers or particles.

The encapsulant 101 may be formed by, for example but not limited to, a molding technique.

Figure 4K:
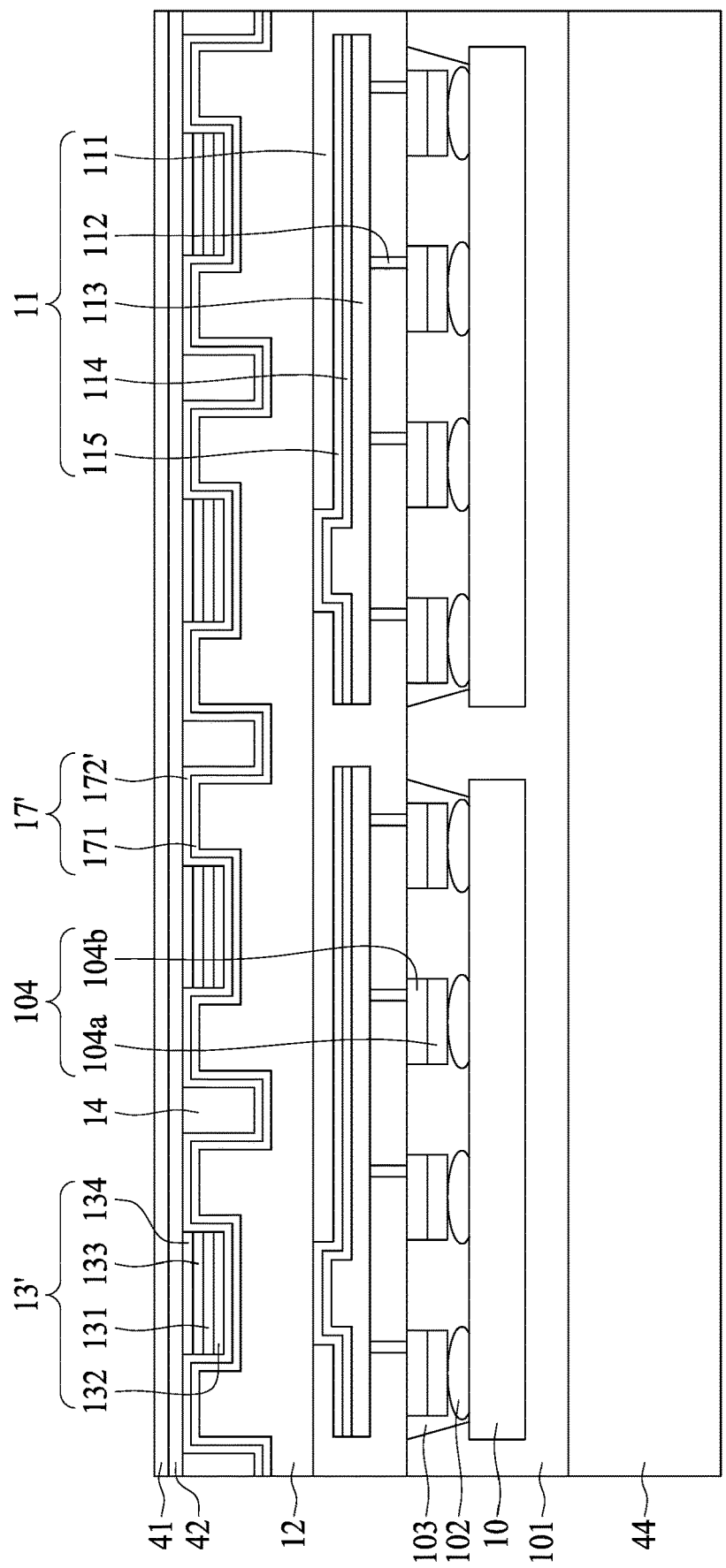

Referring to FIG. 4K, the carrier 40 is removed and the structure as shown in FIG. 4J is turned upside down and disposed on a carrier 44.

Figure 4L:
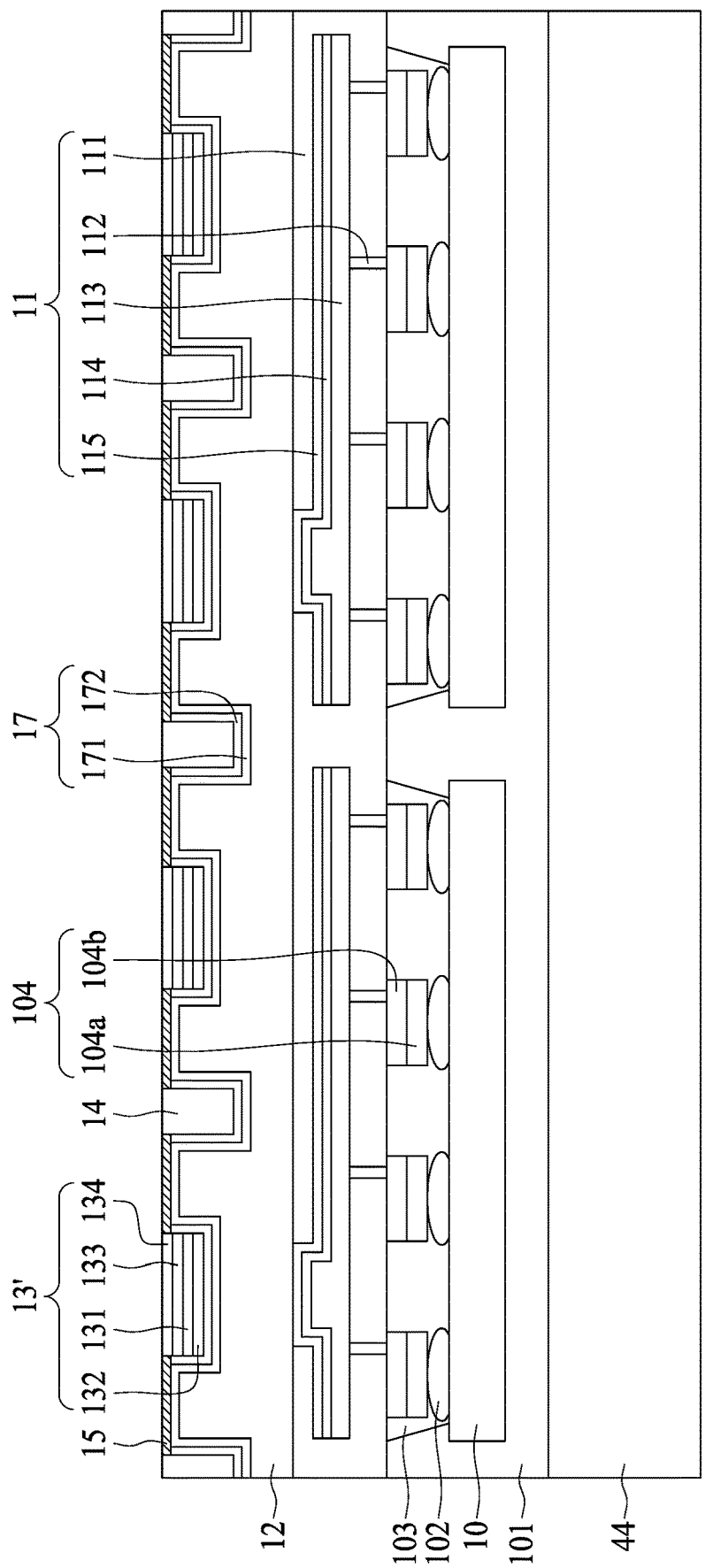

Referring to FIG. 4L, the layers 41 and 42 are removed.

Subsequent to the removal of the layers 41 and 42, the layer 172' is exposed to air. The exposed layer 172' may be oxidized to form a protection layer 15. Subsequent to the removal of the layers 41 and 42, the layer 134 is exposed to air. The exposed layer 134 may be oxidized.

The protection layer 15 may include metal oxide. The protection layer 15 may include, for example but is not limited to, titanium oxide (e.g. TiO, $Ti_2O_3$, $Ti_3O_5$ and $TiO_2$).

Figure 4M:
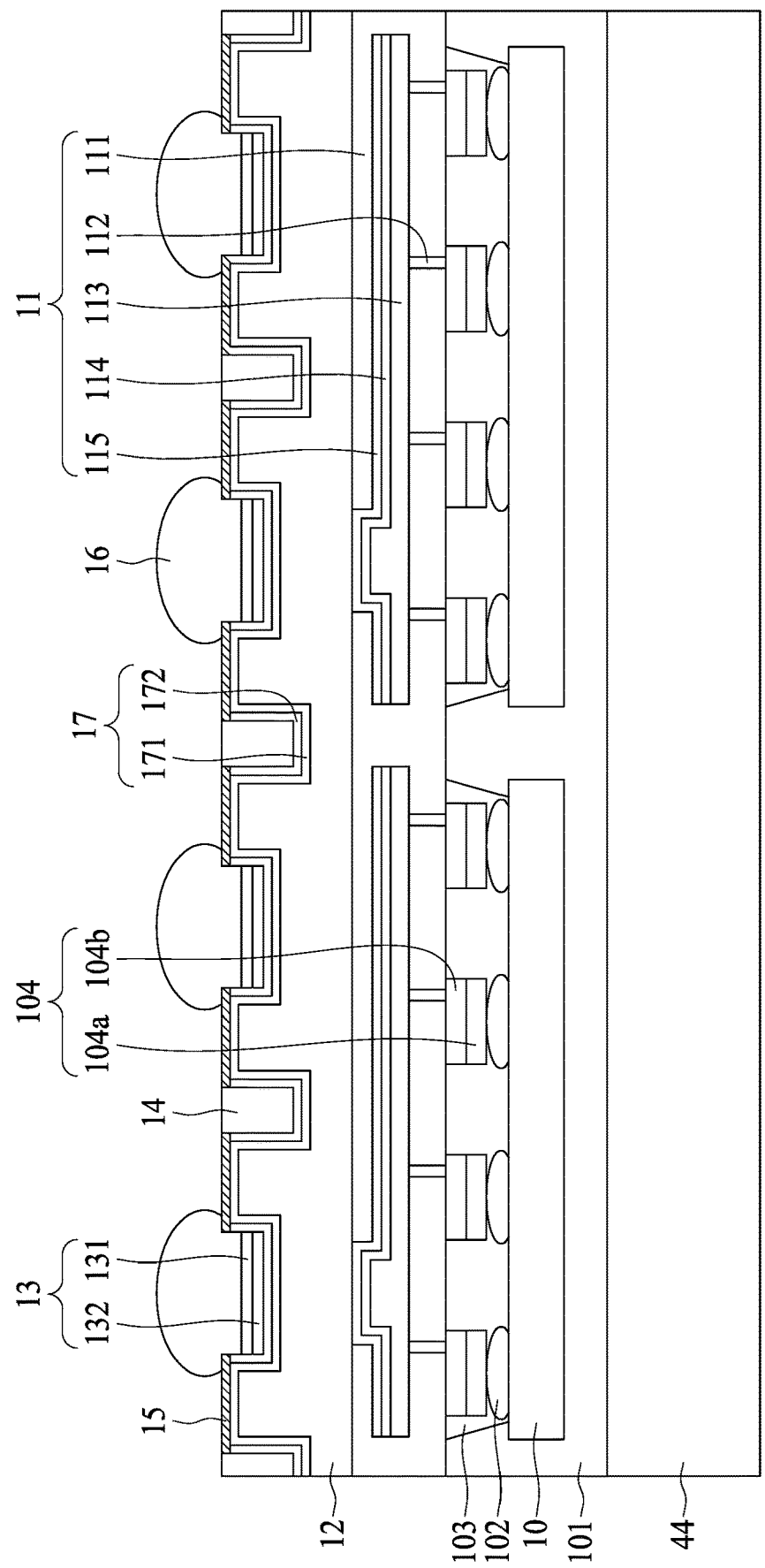

Referring to FIG. 4M, the oxidized layer 134 is removed and the connection elements 16 are placed on the UBM stricture 13.

The oxidized layer 134 may be removed by, for example but not limited to, wet etching technique, dry etching technique or other suitable technique. The protection layers 15 may prevent the etchant (e.g. nitric acid) from damaging the conductive layer 171 during etching the oxidized layer 134. The protection layers 15 may prevent the etchant (e.g. nitric acid) from damaging the conductive layer 172 during etching the oxidized layer 134. The protection layers 15 may prevent the etchant (e.g. nitric acid) from damaging the conductive pad 12 during etching the oxidized layer 134. The protection layers 15 may avoid crack or peel-off issue during etching the oxidized layer 134.

The connection elements 16 are placed on the layers 133, which is exposed subsequent to the removal of the oxidized layer 134 (not shown in FIG. 4M). The layers 133 may be merged or fused with the connection elements 16.

The connection element 16 may include, for example but is not limited to, solder or other suitable material(s).The connection element 16 may include, for example but is not limited to, gold, solder, tin, nickel or other suitable material(s). The connection element 16 may include an alloy of gold and tin solder. The connection element 16 may include an alloy of silver and tin solder. The connection element 16 may include, for example but is not limited to, $(Ni, Au)_3Sn_2$ or other suitable material(s).

A singulation operation is performed to produce a semiconductor device package similar to or same as the semiconductor device package 1 shown in FIG. 1A.

FIG. 5A, FIG. 5B, FIG. 5C, FIG. 5D, FIG. 5E, FIG. 5F, FIG. 5G, FIG. 5H, FIG. 5I, FIG. 5J, FIG. 5K, FIG. 5L, FIG. 5M, FIG. 5N, FIG. 5O and FIG. 5P illustrate operations of manufacturing a semiconductor device package in accordance with some embodiments of the subject application.

Figure 5A:
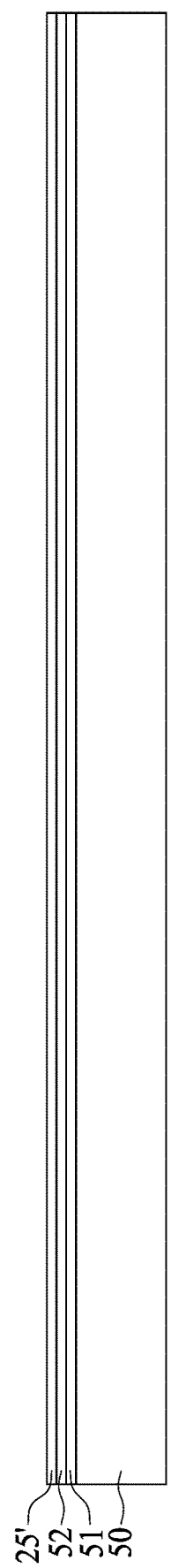

Referring to FIG. 5A, a carrier 50 is provided. A layer 51 is formed on the carrier 50. A layer 52 is formed on the layer 51. A conductive layer 25' is formed on the layer 52.

The layer 51 may include, for example but is not limited to, titanium or other suitable material. The layer 52 may include, for example but is not limited to, copper or other suitable material. The conductive layer 25' may include, for example but is not limited to, tantalum or other suitable material.

The layer 51 may be formed by, for example but not limited to, a coating, printing, or screening process. The layer 52 may be formed by, for example but not limited to, a coating, printing, or screening process.

Figure 5B:
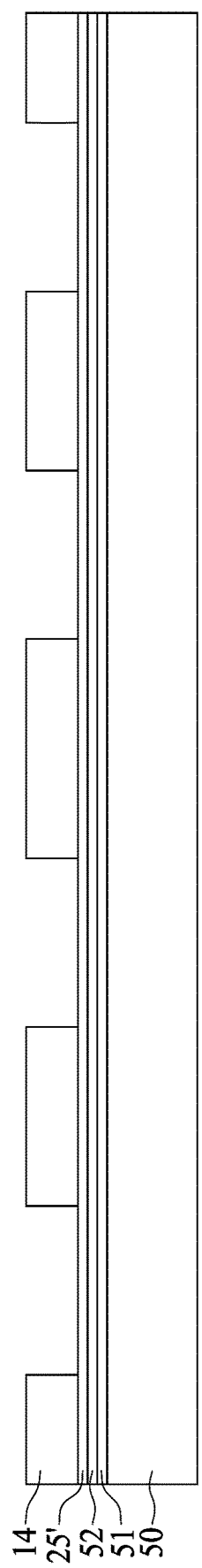

Referring to FIG. 5B, a patterned passivation layer 14 are formed on the layer 42. A portion of the conductive layer 25' is covered by the patterned passivation layer 14.

Figure 5C:
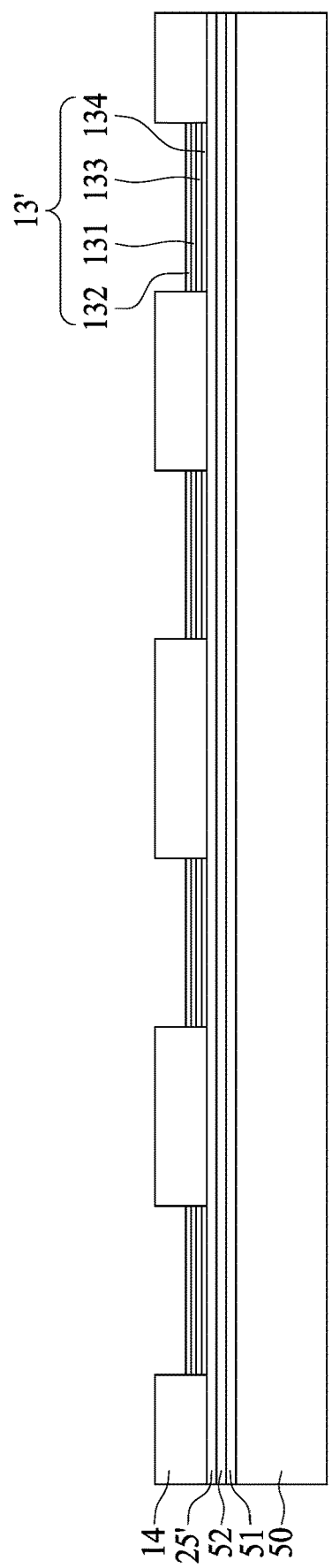

Referring to FIG. 5C, UBM structures 13' are formed on the layer 52. The UBM structure 13' may include a multi-layer structure. The UBM structure 13' includes a conductive layer 131, a conductive layer 132, a conductive layer 133 and a conductive layer 134.

The conductive layer 134 is formed on the conductive layer 25'. The conductive layer 133 is formed on the conductive layer 134. The conductive layer 131 is formed on the conductive layer 133. The conductive layer 132 is formed on the conductive layer 131. The conductive layer 134 may include, for example but is not limited to, nickel or other suitable material. The conductive layer 133 may include, for example but is not limited to, gold or other suitable material. The conductive layer 131 may include, for example but is not limited to, nickel or other suitable material. The conductive layer 132 may include, for example but is not limited to, copper or other suitable material.

Figure 5D:
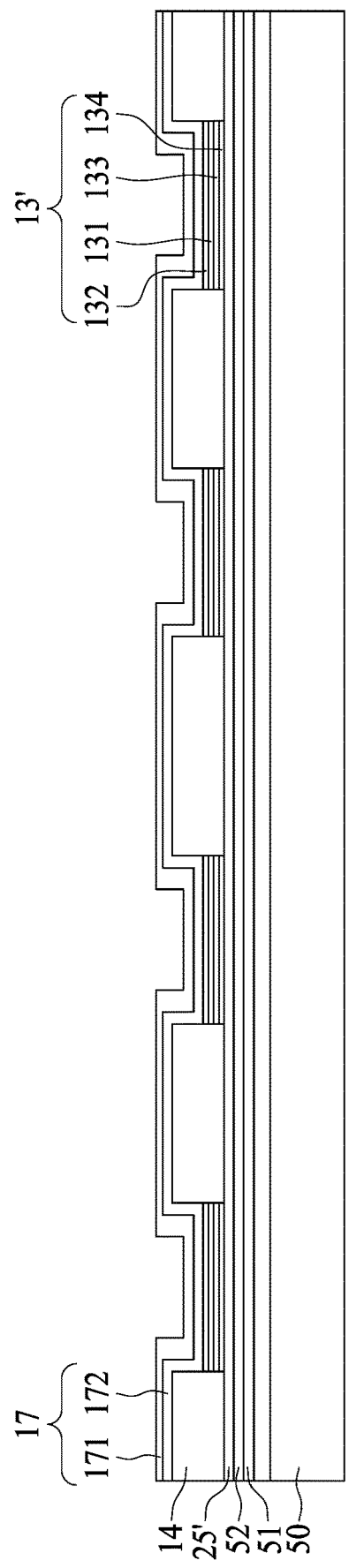

Referring to FIG. 5D, a conductive layer 17 is formed. The conductive layer 17 includes a conductive layer 171 and a conductive layer 172.

The conductive layer 17 is formed on the passivation layer 14 and the UBM structure 13'. The conductive layer 17 covers the passivation layer 14 and the UBM structure 13'. The conductive layer 172 is formed on the passivation layer 14 and the UBM structure 13'. The conductive layer 171 is formed on the conductive layer 172.

The conductive layer 172 may include, for example but is not limited to, titanium or other suitable material. The conductive layer 171 may include, for example but is not limited to, copper or other suitable material.

Figure 5E:
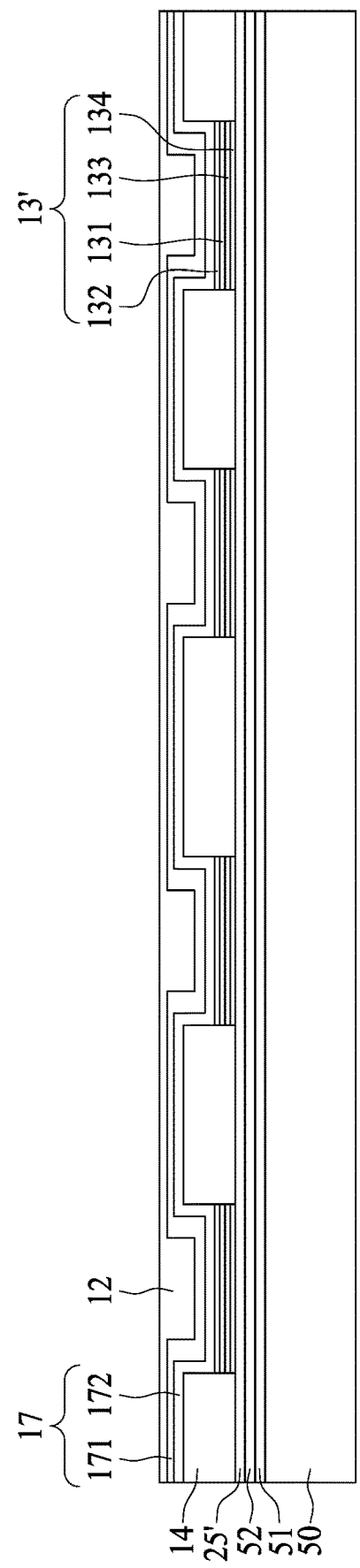

Referring to FIG. 5E, a conductive pad 12 is formed on the conductive layer 17. The conductive pad 12 may include, for example but is not limited to, copper or other suitable material.

Figure 5F:
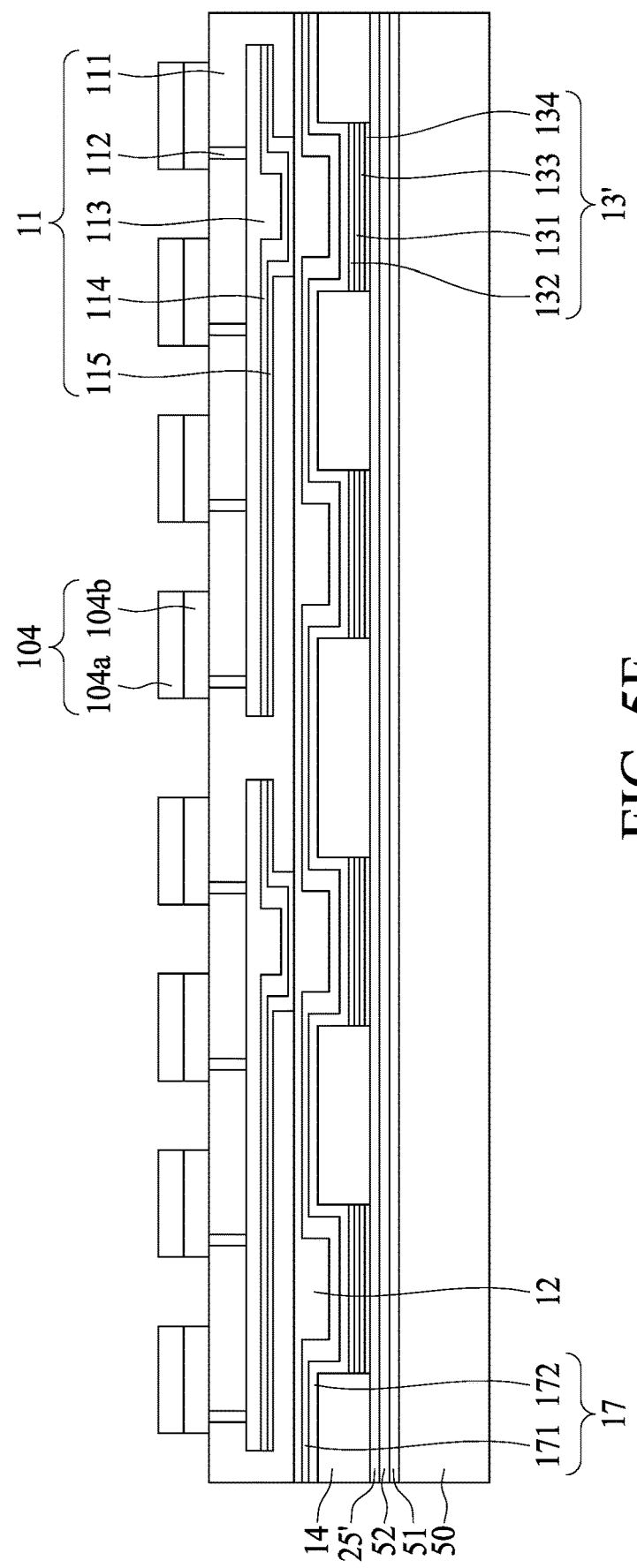

Referring to FIG. 5F, a redistribution layer 11 and UBM structures are formed. The redistribution layer 11 is formed on the conductive pad 12. UBM structures 104 are formed on the redistribution layer 11.

The redistribution layer 11 includes a dielectric layer 111, conductive interconnections (e.g. through-vias) 112 and patterned conductive layers 113, 114, 115. The dielectric layer 111 is formed on the conductive pad 12. The dielectric layer 111 exposes a portion of the conductive pad 12. The patterned conductive layer 115 is formed on the conductive pad 12 and the dielectric layer 111. The patterned conductive layer 114 is formed on the patterned conductive layer 115. The patterned conductive layer 113 is formed on the patterned conductive layer 114. The conductive interconnections 112 are formed on the patterned conductive layer 112. The dielectric layer 111 covers, surrounds or seals the conductive interconnections 112 and patterned conductive layers 113, 114, 115. A portion of the conductive interconnections 112 is exposed by the dielectric layer 111. The conductive pad 12 is electrically connected to the conductive interconnections 112 through the patterned conductive layers 113, 114, 115.

The UBM structures 104 are formed on the redistribution layer 10. The UBM structures 104 are formed on the conductive interconnections 112. The UBM structures 104 include conductive layers 104a and 104b. The conductive layers 104b are formed on the redistribution layer 11. The conductive layers 104b are formed on the conductive interconnections 112. The conductive layers 104a are formed on the conductive layers 104b.

Figure 5G:
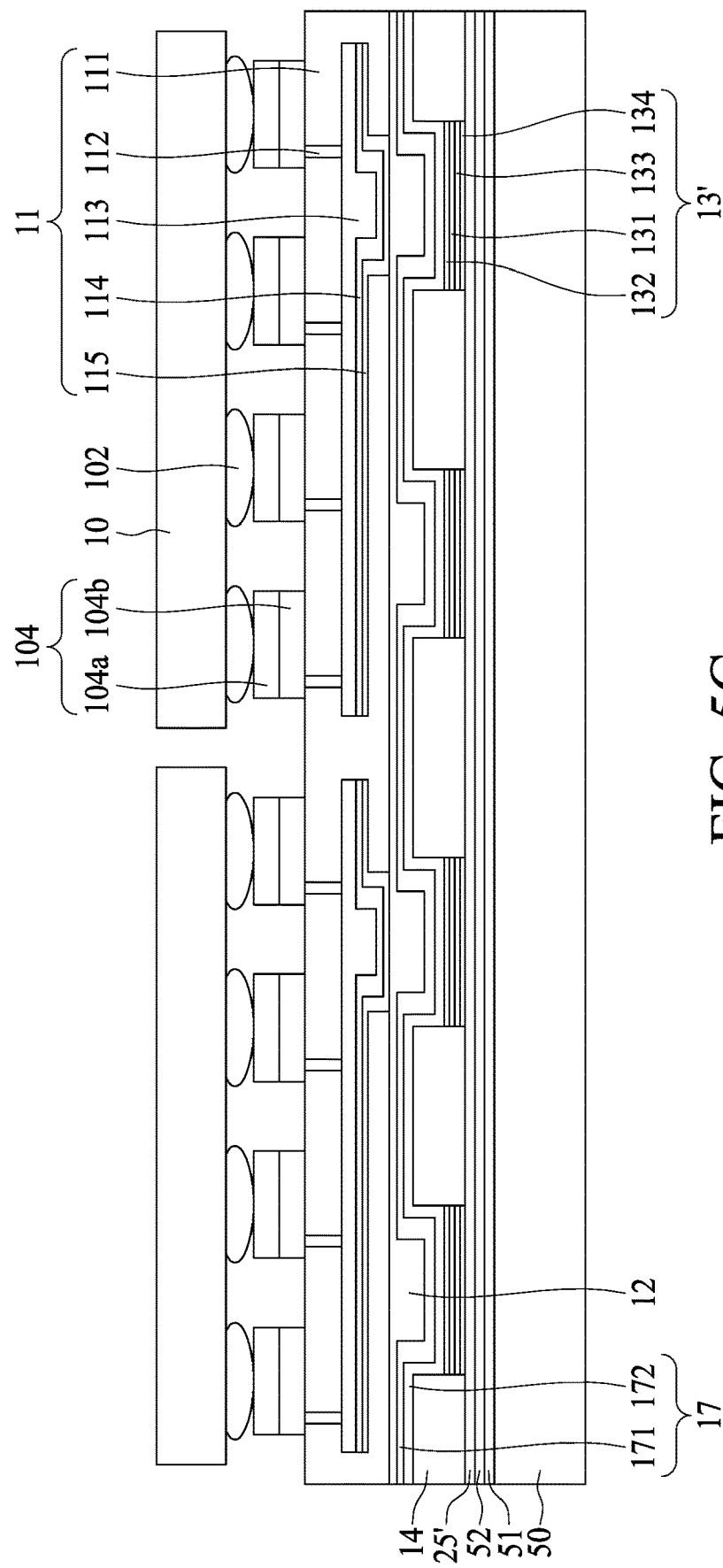

Referring to FIG. 5G, connection elements 102 are formed. Semiconductor devices 10 are disposed on the connection elements 102.

The connection elements 102 are formed on the UBM structures 104. The connection elements 102 are formed on the conductive layer 104a. The semiconductor devices 10 are disposed on the connection elements 102. The semiconductor devices 10 are electrically connected to the redistribution layer 11 through the connection elements 102 and the UBM structures 104.

The semiconductor devices 10 may be bonded to the redistribution layer 11, for example but not limited to, a flip-chip bonding technique.

Figure 5H:
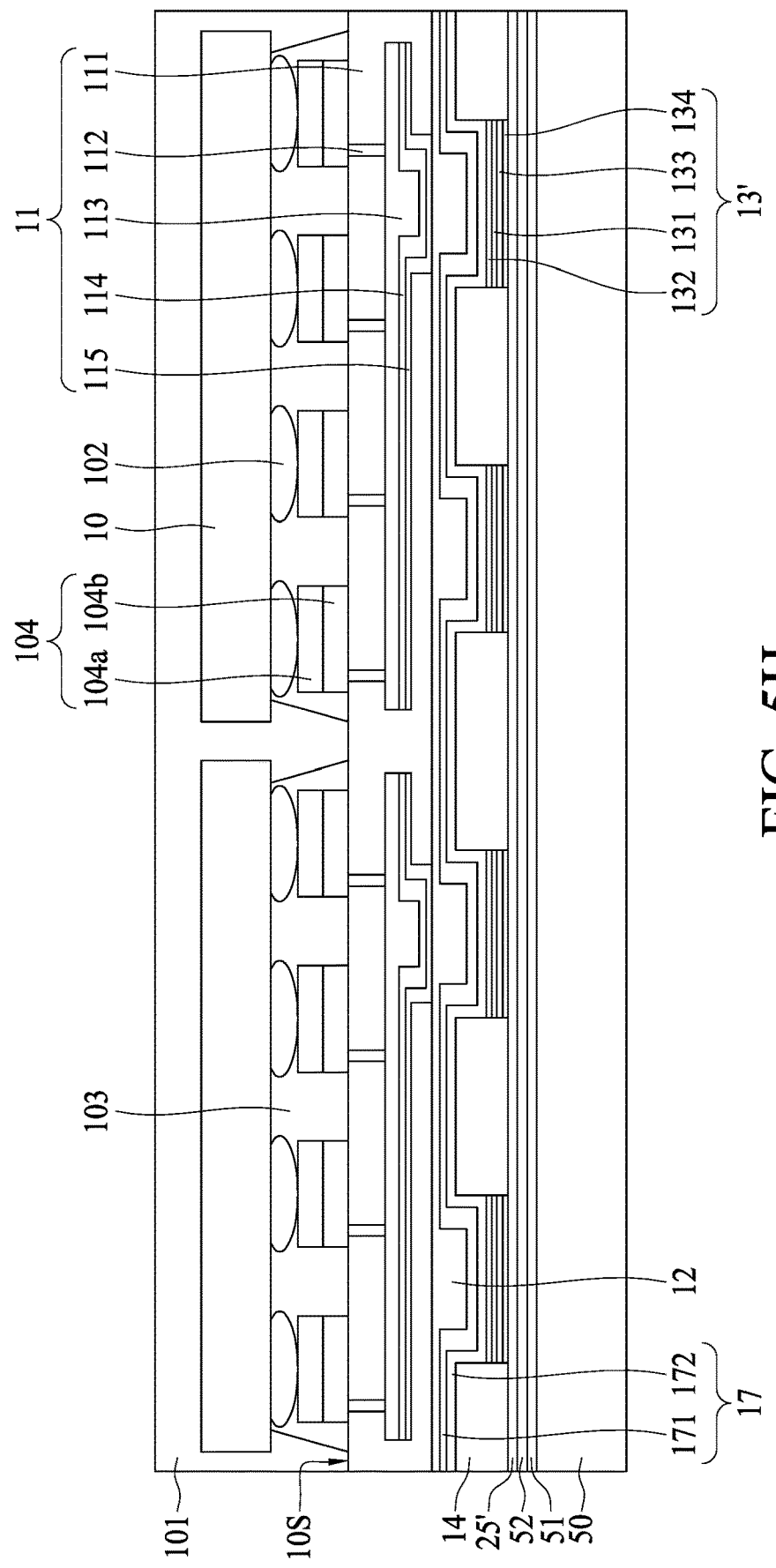

Referring to FIG. 5H, an underfill or encapsulant is disposed between the semiconductor device 10 and the redistribution layer 11. An encapsulant 101 is disposed on the redistribution layer 11.

The underfill or encapsulant 103 covers or encapsulates the connection elements 102. The underfill or encapsulant 103 covers or encapsulates the UBM structures 104. The encapsulant 103 may include epoxy. The encapsulant 103 may include fillers or particles.

The encapsulant 101 covers or encapsulates the semiconductor device 10. The encapsulant 101 covers or encapsulates the connection element 102. The encapsulant 101 covers or encapsulates the UBM structures 104. The encapsulant 101 may include epoxy. The encapsulant 101 may include fillers or particles.

The encapsulant 101 may be formed by, for example but not limited to, a molding technique.

Figure 5I:
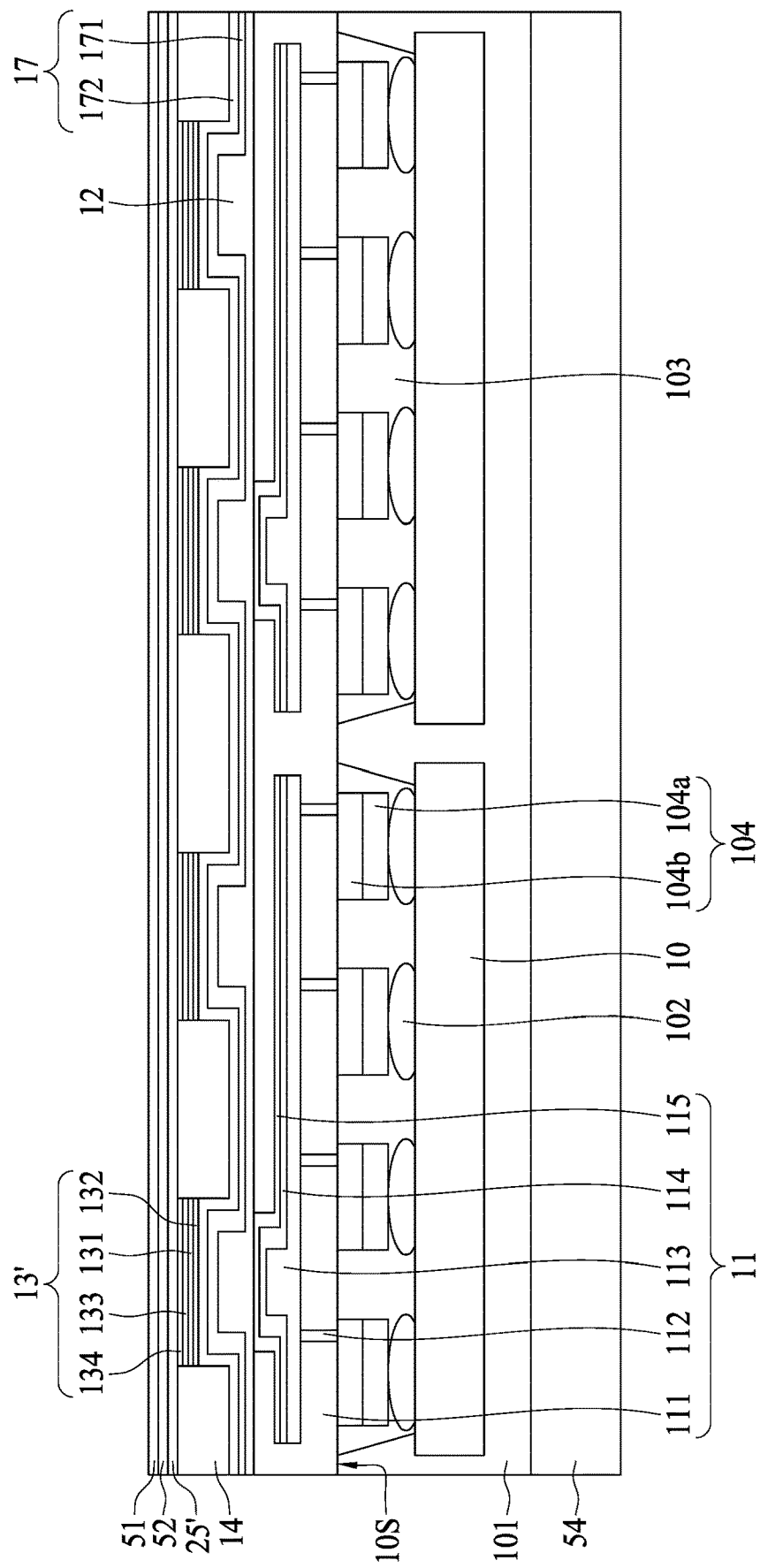

Referring to FIG. 5I, the carrier 50 is removed and the structure as shown in FIG. 5H is turned upside down and disposed on a carrier 54.

Figure 5J:
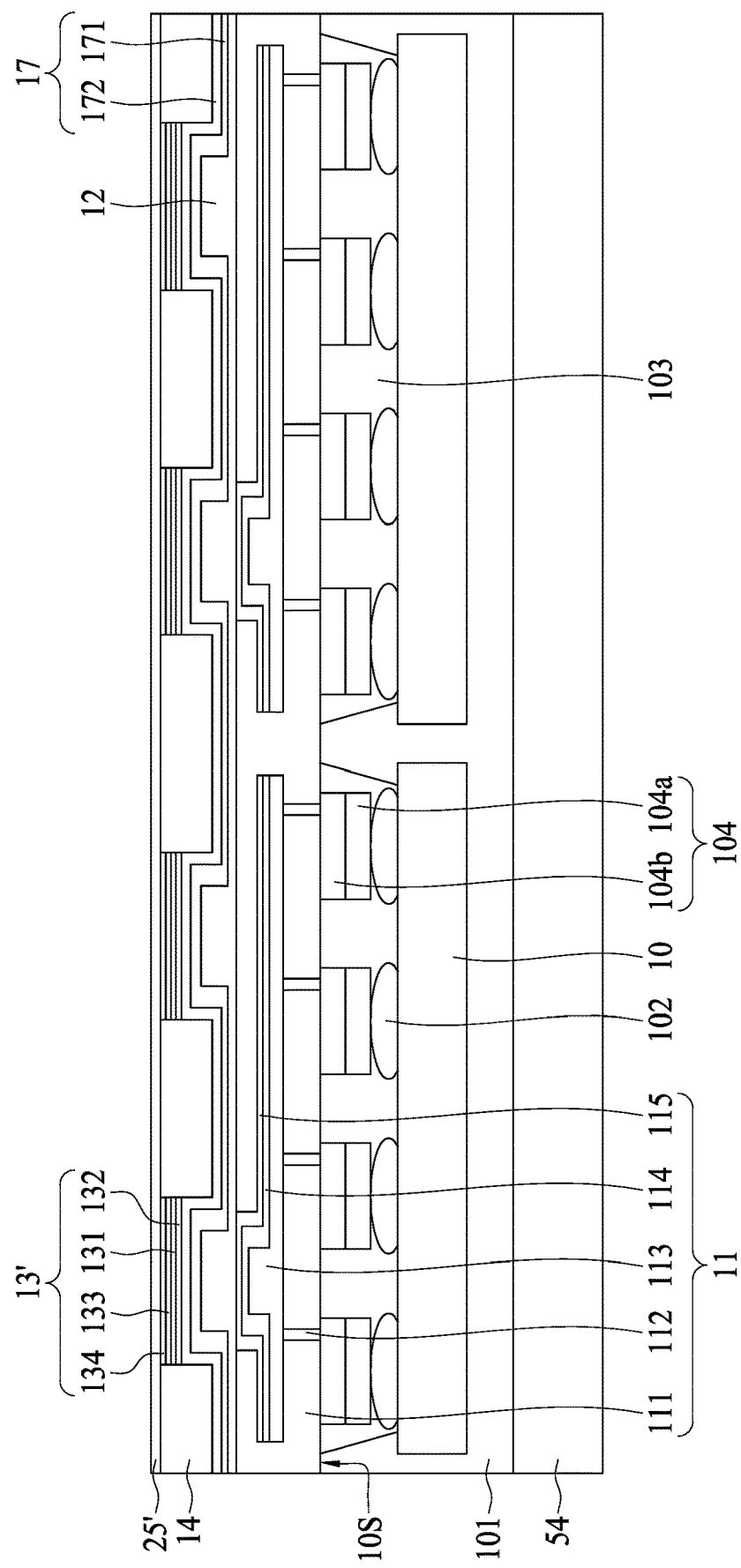

Referring to FIG. 5J, the layers 51 and 52 are removed to expose the layer 25'.

Figure 5K:
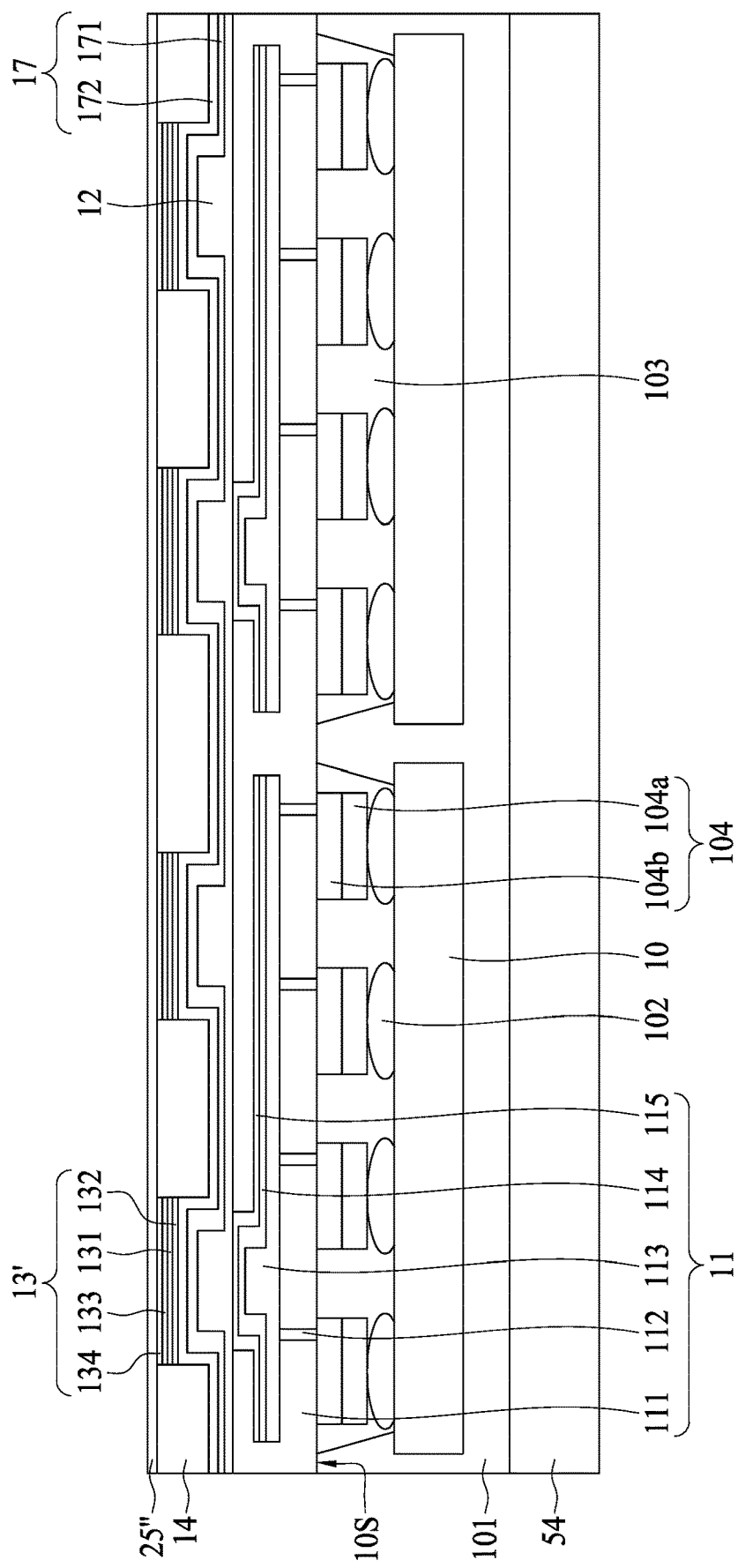

Referring to FIG. 5K, an oxidization technique (e.g. anodic oxidation (AO) technique) is applied to the layer 25' for form a layer 25".

The layer 25" may include metal oxide. The protection layer 25" may include, for example but is not limited to, tantalum oxide (e.g. $Ta_2O_5$ and $TaO_2$).

Figure 5L:
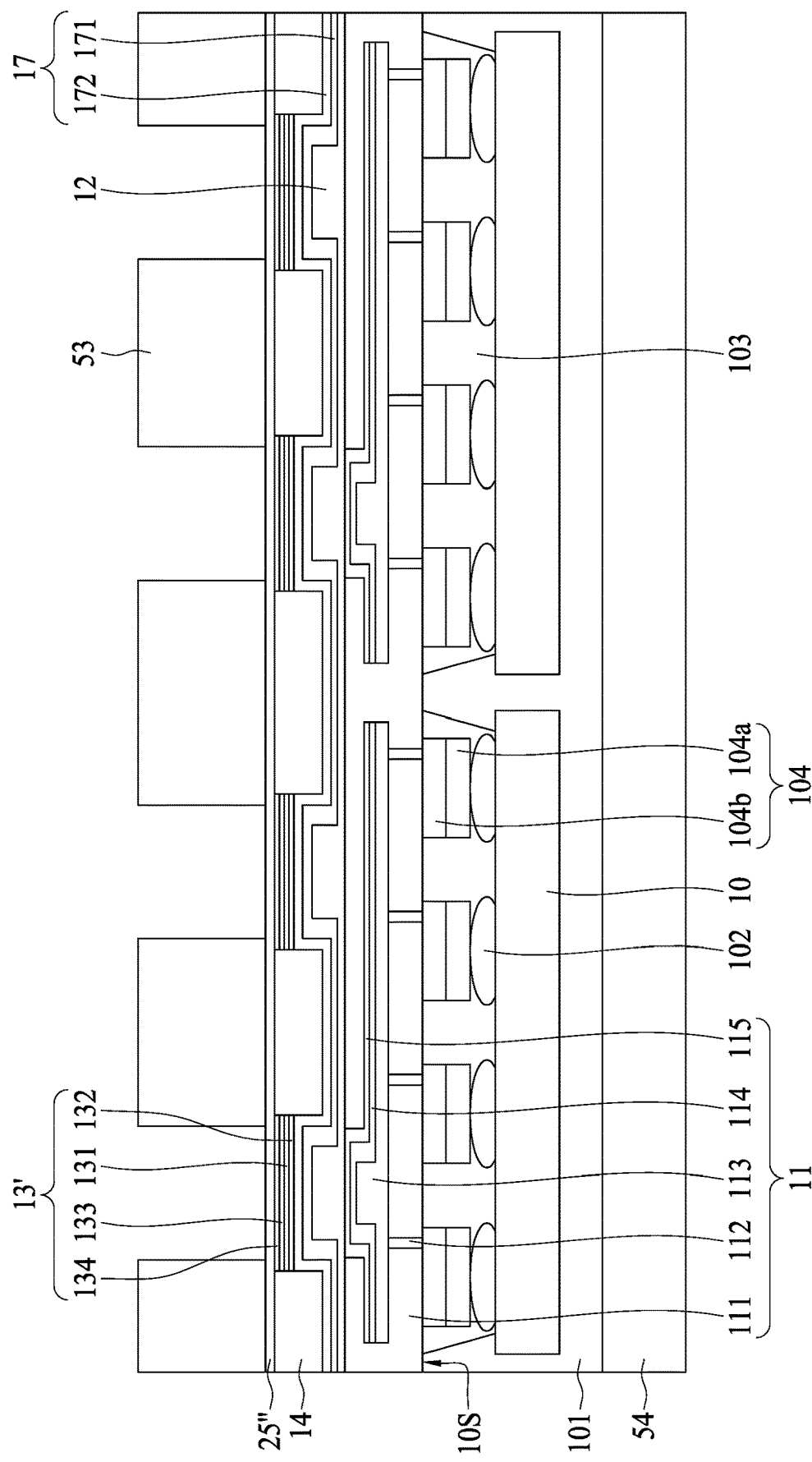

Referring to FIG. 5L, patterned photo-sensitive material 53 is formed on the layer 25". A portion of the layer 25" is covered by the patterned photo-sensitive material 53. The patterned photo-sensitive material 53 expose a portion of the layer 25".

Figure 5M:
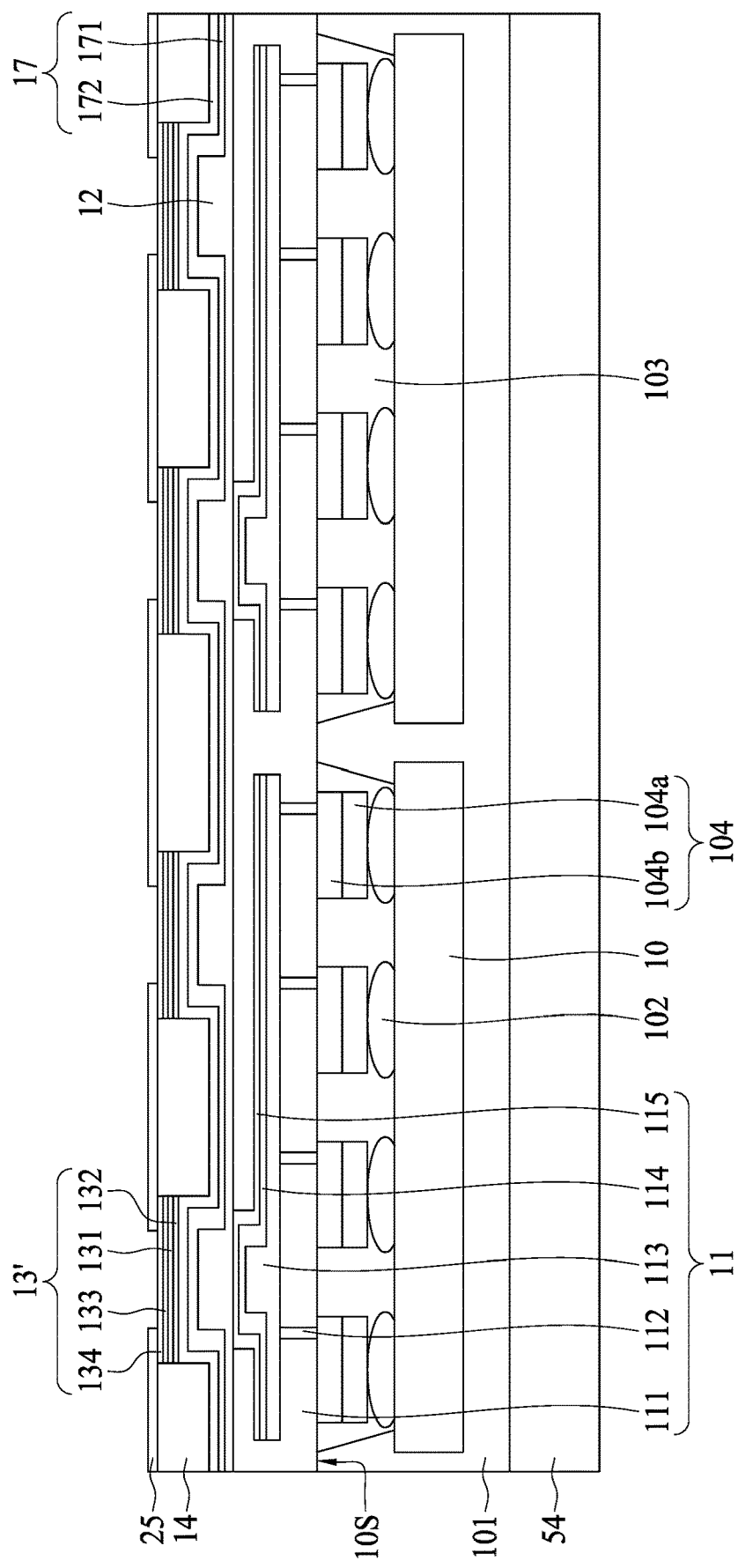

Referring to FIG. 5M, the exposed portion of the layer 25" as shown in FIG. 5L is removed to for a protection layer 25. The patterned photo-sensitive material 53 is removed.

The exposed portion of the layer 25" may be removed by, for example but not limited to, a dry etching technique or a wet etching technique.

Figure 5N:
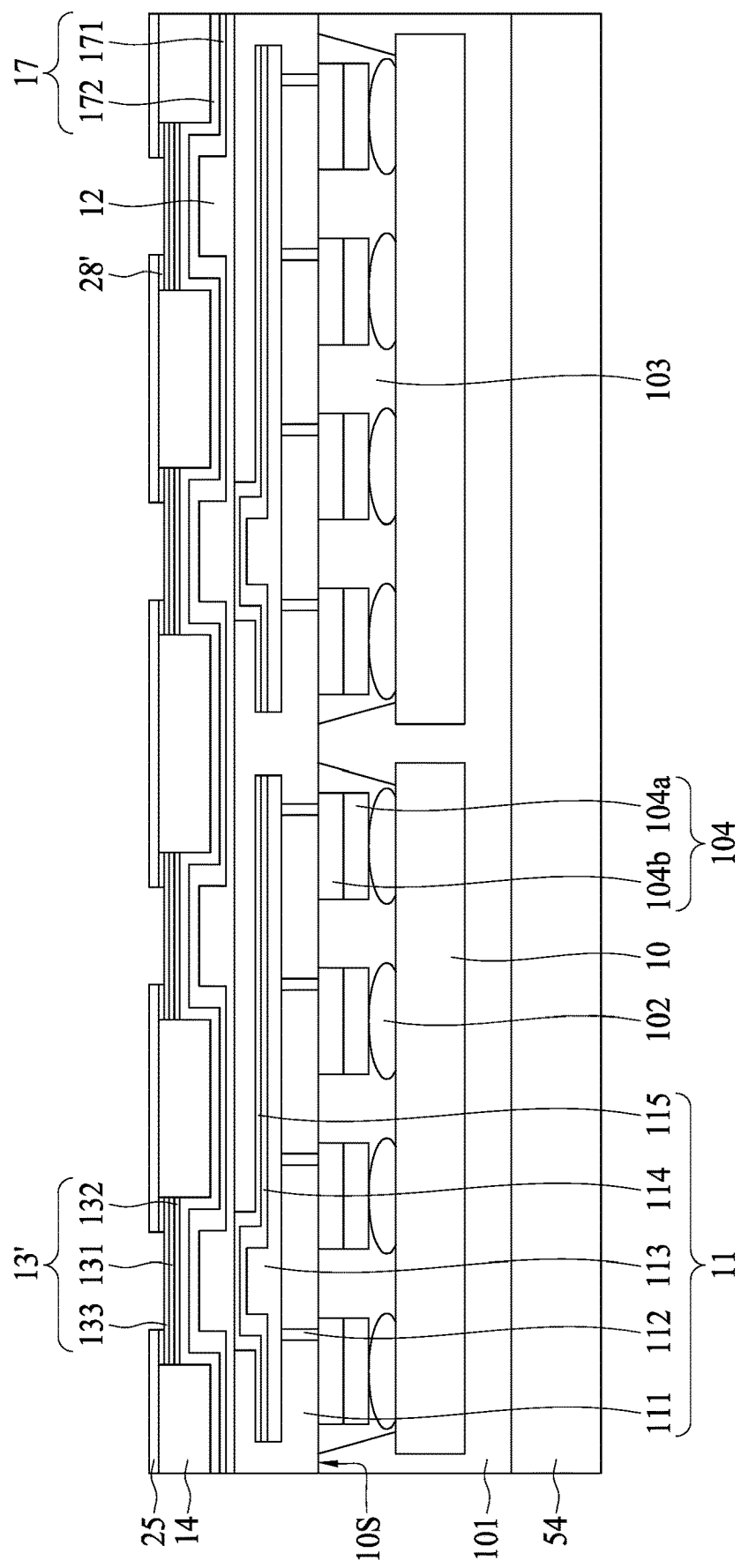
Figure 50:
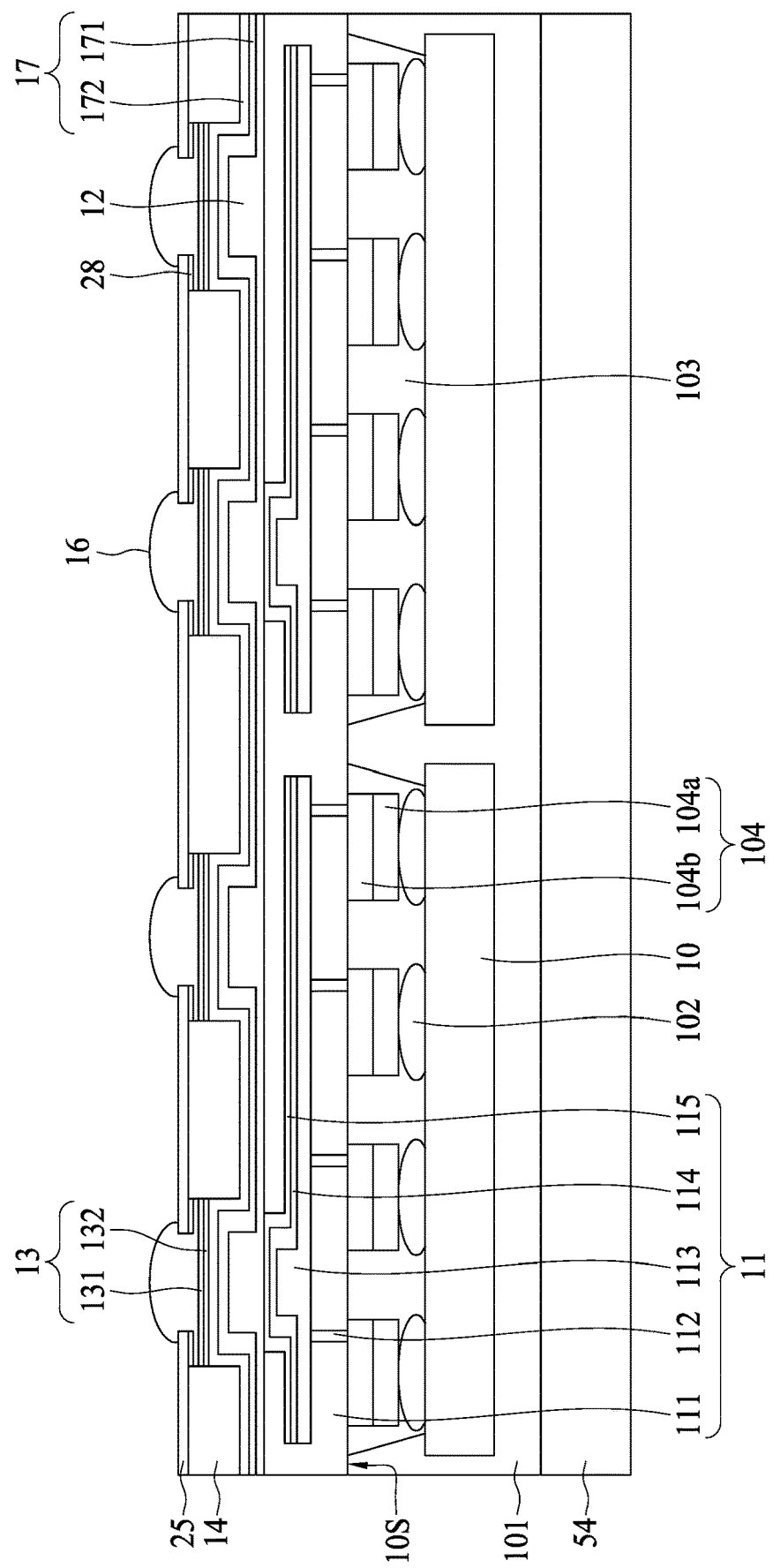

Referring to FIG. 5N, a portion of the layer 134 is removed to form a layer 28'

The layer 134 may be removed by, for example but not limited to, a dry etching technique or a wet etching technique. A portion of the layers 28' is exposed to air.

A structure similar to the protection layer 25 and the protection layer 28 illustrated and described with reference to FIG. 2B or FIG. 2C may be formed where a wet etching operation is performed to the layer 25" and a dry etching operation is performed to the conductive layer 134 in the above operations.

A structure similar to the protection layer 25 and the protection layer 28 illustrated and described with reference to FIG. 2B or FIG. 2C may be formed where a dry etching operation is performed to the layer 25" and a dry etching operation is performed to the conductive layer 134 in the above operations.

A structure similar to the protection layer 25 and the protection layer 28 illustrated and described with reference to FIG. 2B and FIG. 2C may be formed where a wet etching operation is performed to the layer 25" and a wet etching operation is performed to the conductive layer 134 in the above operations.

A structure similar to the protection layer 25 and the protection layer 28 illustrated and described with reference to FIG. 2D and FIG. 2E may be formed where a dry etching operation is performed to the layer 25" and a wet etching operation is performed to the conductive layer 134 in the above operations.

The protection layer 25 and the protection layer 28' may prevent nitric acid from etching the conductive layer 171. The protection layer 25 and the protection layer 28' may prevent nitric acid from etching conductive layer 172. The protection layer 25 and the protection layer 28' may prevent nitric acid from etching the conductive pad 12. The protection layer 25 and the protection layer 28' may avoid crack or peel-off issue during manufacture.

Referring to FIG. 5O, connection elements 16 are placed on the UBM strictures 13.

The connection elements 16 are placed on the layers 133. The layers 133 may be merged or fused with the connection elements 16.

The connection element 16 may include, for example but is not limited to, solder or other suitable material(s). The connection element 16 may include, for example but is not limited to, gold, solder, tin, nickel or other suitable material(s). The connection element 16 may include an alloy of gold and tin solder. The connection element 16 may include an alloy of silver and tin solder. The connection element 16 may include, for example but is not limited to, (Ni, $Au)_3Sn_2$ or other suitable material(s).

The protection layers 28 are formed after the connection elements 16 are placed on the UBM structures 13. The protection layer 28 may include, for example but is not limited to, nickel or other suitable conductive or barrier material. The protection layer 28 may include intermetallic compound (IMC), for example but is not limited to, $Ni_3Sn_4$.

Figure 5P:
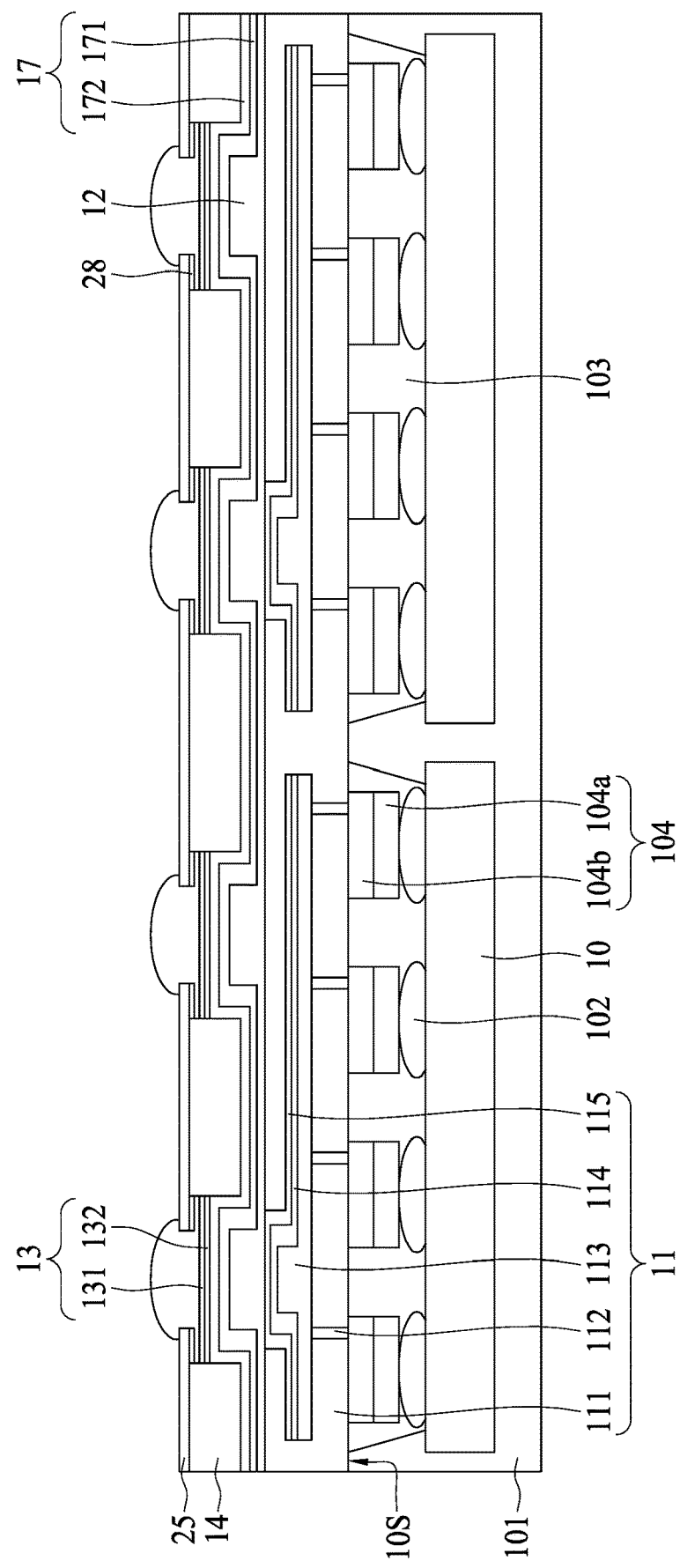

Referring to FIG. 5P, the carrier 54 is removed.

A singulation operation is performed to produce a semiconductor device package similar to or same as the semiconductor device package 2 shown in FIG. 2A.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" or "about" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 μm, no greater than 2 μm, no greater than 1 μm, or no greater than 0.5 μm. A surface can be deemed to be planar or substantially planar if a displacement of the surface relative to a flat plane between any two points on the surface is no greater than 5 μm, no greater than 2 μm, no greater than 1 μm, or no greater than 0.5 μm.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

Spatial descriptions, such as "above," "below," "up," "left," "right," "down," "top," "bottom," "vertical," "horizontal," "side," "higher," "lower," "upper," "over," "under," "downward," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such arrangement While the present disclosure has been described and illustrated with reference to specific embodiments thereof, these descriptions and illustrations do not limit the present disclosure. It can be clearly understood by those skilled in the art that various changes may be made, and equivalent components may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A semiconductor device package, comprising:
a semiconductor device having an active surface;
a redistribution layer disposed on the active surface of the semiconductor device and electrically connected to the semiconductor device;
an under bump metallurgy (UBM) structure disposed on the redistribution layer;
a passivation layer disposed on the redistribution layer and surrounding the UBM structure and having a first top surface; and
a protection layer disposed on the redistribution layer and having a first top surface,
wherein the first top surface of the passivation layer is substantially coplanar with the first top surface of the protection layer.

2. The semiconductor device package of claim 1, wherein the protection layer includes metal oxide.

3. The semiconductor device package of claim 2, wherein the protection layer includes titanium oxide.

4. The semiconductor device package of claim 1, wherein the protection layer comprises a first layer disposed on the redistribution layer and a second layer disposed on the first layer.

5. The semiconductor device package of claim 4, wherein the first layer of the protection layer includes a first metal.

6. The semiconductor device package of claim 4, wherein the second layer of the protection layer includes metal oxide.

7. The semiconductor device package of claim 1, further comprising s a conductive pad surrounded by the passivation layer.

8. The semiconductor device package of claim 1, further comprising a patterned conductive layer surrounding the UBM structure.

9. The semiconductor device package of claim 8, wherein an intermetallic compound (IMC) layer of the UBM structure is in contact with a side surface of the patterned conductive layer.

10. The semiconductor device package of claim 8, further comprising a connection element in contact with the patterned conductive layer.

11. The semiconductor device package of claim 8, wherein the patterned conductive layer is disposed between a conductive pad and the passivation layer.

12. A semiconductor device package, comprising:
a semiconductor device having an active surface;
a redistribution layer disposed on the active surface of the semiconductor device and electrically connected to the semiconductor device;
an under bump metallurgy (UBM) structure disposed on the redistribution layer;
a passivation layer disposed on the redistribution layer and surrounding the UBM structure the passivation layer having a first top surface;
a first patterned conductive layer disposed on the UBM structure, and having a first top surface; and
a connection element disposed between the UBM structure and the first patterned conductive layer;
wherein the first top surface of the passivation layer is substantially coplanar with the first top surface of the first patterned conductive layer.

13. The semiconductor device package of claim 12, further comprising a protection layer disposed on the first patterned conductive layer.

14. The semiconductor device package of claim 13, wherein the protection layer comprises metal oxide.

15. The semiconductor device package of claim 14, wherein the protection layer comprises tantalum oxide.

16. The semiconductor device package of claim 15, wherein the protection layer comprises a first layer disposed on the first patterned conductive layer and the passivation layer and a second layer disposed on the first layer.

17. The semiconductor device package of claim 13, wherein a sidewall of the protection layer is substantially coplanar with a sidewall of the first patterned conductive layer.

18. The semiconductor device package of claim 12, wherein the connection element between the first patterned conductive layer and the UBM structure is in direct contact with the passivation layer.

19. A method of forming a semiconductor device package, comprising:
providing a carrier;
disposing a passivation layer and an under bump metallurgy (UBM) structure on the carrier;
disposing a patterned conductive layer on the passivation layer and the UBM structure,
wherein a first top surface of the passivation layer is substantially coplanar with a first top surface of the patterned conductive layer;
disposing a redistribution layer on the patterned conductive layer;
disposing a semiconductor device on the redistribution layer and electrically connected to the redistribution layer; and
exposing the first top surface of the patterned conductive layer to air or oxygen and forming a protection layer such that the first top surface of the passivation layer is substantially coplanar with a first top surface of the protection layer.

20. The method of claim 19, wherein the protection layer comprises a first layer exposed to air and a second layer covered by the first layer.

* * * * *